(12) United States Patent
Rong

(10) Patent No.: US 11,972,536 B1
(45) Date of Patent: Apr. 30, 2024

(54) MONITORING PROGRESS OF OBJECT CONSTRUCTION

(71) Applicant: DALUX ApS, Copenhagen (DK)

(72) Inventor: Anders Rong, Greve (DK)

(73) Assignee: DALUX APS, Copenhagen (DK)

( * ) Notice: Subject to any disclaimer, the term of this patent is extended or adjusted under 35 U.S.C. 154(b) by 0 days.

(21) Appl. No.: 18/501,772

(22) Filed: Nov. 3, 2023

(51) Int. Cl.
  *G06T 19/20* (2011.01)
  *G06T 5/50* (2006.01)
  *G06T 7/11* (2017.01)
  *G06V 10/44* (2022.01)

(52) U.S. Cl.
  CPC ........... *G06T 19/20* (2013.01); *G06T 5/50* (2013.01); *G06T 7/11* (2017.01); *G06V 10/44* (2022.01); *G06T 2207/20221* (2013.01); *G06T 2219/2004* (2013.01); *G06V 2201/07* (2022.01)

(58) Field of Classification Search
  CPC ... G06T 19/20; G06T 5/50; G06T 7/11; G06T 2207/20221; G06T 2219/2004; G06V 10/44; G06V 2201/07
  See application file for complete search history.

(56) References Cited

U.S. PATENT DOCUMENTS

| | | |
|---|---|---|
| 6,489,955 B1 | 12/2002 | Newhall |
| 9,070,216 B2 | 6/2015 | Golparvar-Fard et al. |
| 11,436,812 B2 | 9/2022 | Fleischman et al. |
| 2013/0155058 A1 * | 6/2013 | Golparvar-Fard ............. G06Q 10/06311 345/419 |
| 2018/0082414 A1 * | 3/2018 | Rozenberg ............... G06T 7/75 |
| 2019/0100928 A1 * | 4/2019 | Raman .................. B62D 21/18 |
| 2022/0064935 A1 * | 3/2022 | Williams ............ E04B 1/34846 |
| 2022/0198709 A1 * | 6/2022 | Sudry ..................... G06F 30/12 |

FOREIGN PATENT DOCUMENTS

WO 2013041101 A1 3/2013

OTHER PUBLICATIONS

Campos, C. et al., "ORB-SLAM3: An Accurate Open-Source Library for Visual, Visual-Inertial and Multi-Map SLAM" arXiv:2007.11898v2 [cs.RO] Apr. 23, 2021; DOI: 10.1109/TRO.2021.3075644; 2007.11898.pdf (arxiv.org), 18 pages.

Campos, C., et al. "Inertial-Only Optimization for Visual-Inertial Initialization", arXiv:2003.05766v1 [cs.RO] Mar. 12, 2020, https://arxiv.org/pdf/2003.05766.pdf, 8 pages.

Chen1, Y. et al., "Bundle Adjustment Revisited" arXiv:1912.03858v1 [cs.CV] Dec. 9, 2019; 1912.03858.pdf (arxiv.org), 10 pages.

Dong, W. et al., "ASH: A Modern Framework for Parallel Spatial Hashing in 3D Perception"; arXiv:2110.00511v2 [cs.CV] Jan. 30, 2023; 2110.00511.pdf (arxiv.org), 18 pages.

(Continued)

*Primary Examiner* — Sing-Wai Wu
(74) *Attorney, Agent, or Firm* — HOLZER PATEL DRENNAN

(57) ABSTRACT

The present invention relates to a method for tracking progress of the construction of objects, in particular walls comprised in a building based on 3D digital representation. Building Information Modeling (BIM) may provide a digital representation of the physical and functional characteristics of a place, such as a building comprising walls and other objects.

30 Claims, 17 Drawing Sheets

(56) References Cited

OTHER PUBLICATIONS

Elfring, J. et al., "Particle Filters: A Hands-On Tutorial", Sensors, 2021, 21, 438, https://doi.org/10.3390/s21020438, 28 pages.
Forster, C. et al., "On-Manifold Preintegration for Real-Time Visual-Inertial Odometry"; IEEE Transactions on Robotics, vol. 33, No. 1, Feb. 2017; TRO16_forster.pdf (uzh.ch), 20 pages.
Fraundorfer, F. and Scaramuzza, D., "Visual Odometry; Part II: Matching, Robustness, Optimization, and Applications" IEEE Robotics & Automation Magazine Jun. 2012, 13 pages.
Gálvez-López, D. and Tardós, JD., "Bags of Binary Words for Fast Place Recognition in Image Sequences"; IEEE Transactions On Robotics, vol. 28, Issue 5, Oct. 2012. Short Paper; main.dvi (doriangalvez.com), 9 pages.
Geneva, P et al., "IMU Noise Model"; IMU Noise Model • ethz-asl/kalibr Wiki • GitHub Accessed: Oct. 27, 2023, 6 pages.
Godsil, S. et al., "Maximum a Posteriori Sequence Estimation Using Monte Carlo Particle Filters", Annals of the Institute of Statistical Mathematics 53, 82-96 (2001), 7 pages.
Hargreaves, S and Harris, M., "Deferred Shading" 6800 Leagues under the sea; Microsoft PowerPoint—deferred_shading.ppt (nvidia.com), 44 pages.
Hargreaves, S., "Deferred Shading"; Game Developers Conference 2014; Deferred Shading (GDC 2004) (utah.edu), 32 pages.
Hartley, R. and Zisserman, A., "Multiple View Geometry in Computer Vision" 2nd Edition (Book); 2004; DOI: https://doi.org/10.1017/CBO9780511811685.
He, K. et al., "Deep Residual Learning for Image Recognition"; arXiv:1512.03385v1 [cs.CV] Dec. 10, 2015; 1512.03385.pdf (arxiv.org), 12 pages.
He, K. et al., "Mask R-CNN"; arXiv:1703.06870v3 [cs.CV] Jan. 24, 2018; 1703.06870.pdf (arxiv.org), 12 pages.
Ho, NH. et al., "Step-Detection and Adaptive Step-Length Estimation for Pedestrian Dead-Reckoning at Various Walking Speeds Using a Smartphone"; Sensors 2016, 16(9), 1423; https://doi.org/10.3390/s16091423, 14 pages.
Khedr, M. and El-Sheimy, N., "A Smartphone Step Counter Using IMU and Magnetometer for Navigation and Health Monitoring Applications"; Sensors 2017, 17(11), 2573; https://doi.org/10.3390/s17112573, 25 pages.
Khedr, M. and El-Sheimy, N., "S-PDR: SBAUPT-Based Pedestrian Dead Reckoning Algorithm for Free-Moving Handheld Devices"; Geomatics 2021, 1(2), 148-176; https://doi.org/10.3390/geomatics1020010, 30 pages.
Kirillov, A. et al., "Segment Anything" arXiv:2304.02643v1 [cs.CV] Apr. 5, 2023; arxiv.org/pdf/2304.02643.pdf, 30 pages.
Klajnscek, T., "Battle-Tested Deferred Rendering on PS3, Xbox 360 and PC"; GDC Europa 2009; GDC Vault—Battle-Tested Deferred Rendering on PS3, Xbox 360 and PC, 3 pages.
Kümmerle, R. et al., "g2o: A General Framework for Graph Optimization" 2011 IEEE International Conference on Robotics and Automation, May 2011, Shanghai, China; kuemmerle11icra.pdf (uni-freiburg.de), 7 pages.
Lefebvre, S. et Hoppe, H., "Perfect Spatial Hashing"; ACM Trans. Graphics (SIGGRAPH), 25(3), 2006; Microsoft Research; Perfect Spatial Hashing (hhoppe.com), 10 pages.
Müller, M., "Blazing Fast Neighbor Search with Spatial Hashing"; Ten Minute Physics; PowerPoint Presentation (matthias-research.github.io) Accessed: Oct. 27, 2023, 11 pages.
Mur-Artal, R. and Tardós JD, "ORB-SLAM2: an Open-Source SLAM System for Monocular, Stereo and RGB-D Cameras", arXiv:1610.06475v2 [cs.RO] Jun. 19, 2017; DOI: 10.1109/TRO.2017.2705103; arxiv.org/pdf/1610.06475.pdf, 9 pages.
Mur-Artal, R et al., "ORB-SLAM: a Versatile and Accurate Monocular SLAM System", arXiv:1502.00956v2 [cs.RO] Sep. 18, 2015; DOI: 10.1109/TRO.2015.2463671; arxiv.org/pdf/1502.00956.pdf, 18 pages.
Redmon, J. et al., "You Only Look Once: Unified, Real-Time Object Detection"; arXiv:1506.02640v5 [cs.CV] May 9, 2016; 1506.02640.pdf (arxiv.org), 10 pages.
Ren, S. et al., "Faster R-CNN: Towards Real-Time Object Detection with Region Proposal Networks"; arXiv:1506.01497v3 [cs.CV] Jan. 6, 2016; 1506.01497.pdf (arxiv.org), 14 pages.
Ronneberger, O. et al., "U-Net: Convolutional Networks for Biomedical Image Segmentation" arXiv:1505.04597v1 [cs.CV] May 18, 2015; https://arxiv.org/pdf/1505.04597.pdf, 8 pages.
Scaramuzza, D. and Fraundorfer, F., "Visual Odometry; Part I: The First 30 Years and Fundamentals" IEEE Robotics & Automation Magazine Dec. 2011, 13 pages.
Schönberger, JL. and Frahm, JM., "Structure-from-Motion Revisited" 2016 IEEE Conference on Computer Vision and Pattern Recognition (CVPR); Accessed: Oct. 27, 2023; Jun. 2016; DOI:10.1109/CVPR.2016.445;; schoenberger2016sfm.pdf (demuc.de), 10 pages.
Stachniss, C., Mobile Robotics Block YouTube; Accessed: Oct. 27, 2023, retrieved at: https://www.youtube.com/watch?v=aGNPtwQyl-4&list=PLgnQpQtFTOGSeTU35ojkOdsscnenP2Cqx.
Stachniss, C., Cyrill Stachniss—Mobile Sensing and Robotics 1 Course, YouTube; Accessed: Oct. 27, 2023, retrieved at: https://www.youtube.com/watch?v=OSsQX-dMwco&list=PLgnQpQtFTOGQJXx-x0t23RmRbjp_yMb4v.
Stachniss, C., Mobile Sensing and Robotics 2 Course, YouTube; Accessed: Oct. 27, 2023, retrieved at: https://www.youtube.com/watch?v=mQvKhmWagB4&list=PLgnQpQtFTOGQh_J16IMwDlji18SWQ2PZ6.
Stachniss, C., Occupancy Grid Maps, YouTube; Accessed: Oct. 27, 2023, retrieved at: https://www.youtube.com/watch?v=v-Rm9TUG9LA.
Stachniss, C., SLAM Course (2013), YouTube; Accessed: Oct. 27, 2023, retrieved at: https://www.youtube.com/playlist?list=PLgnQpQtFTOGQrZ4O5QzblHgl3b1JHimN_.
Sumikura, S. et al., "OpenVSLAM: A Versatile Visual SLAM Framework" arXiv:1910.01122v3 [cs.CV] Apr. 6, 2023; OpenVSLAM: A Versatile Visual SLAM Framework (arxiv.org).
Sun, C. et al., "HoHoNet: 360 Indoor Holistic Understanding with Latent Horizontal Features"; arXiv:2011.11498v3 [cs.CV] Sep. 9, 2021; 2011.11498.pdf (arxiv.org), 15 pages.
Tan, M. and Le, QV., "EfficientNet: Rethinking Model Scaling for Convolutional Neural Networks"; arXiv:1905.11946v5 [cs.LG] Sep. 11, 2020; EfficientNet: Rethinking Model Scaling for Convolutional Neural Networks (arxiv.org), 11 pages.
Thrun, S. et al., "Probabilistic Robotics" (Book); 2005, probabilistic-robotics.org.
Urban S. and Hinz S., "Multicol-Slam—A Modular Real-Time Multi-Camera Slam System" arXiv:1610.07336v1 [cs.CV] Oct. 24, 2016; 1610.07336.pdf (arxiv.org), 15 pages.
Valiant, M., "Deferred Rendering in Killzone 2"; Guerrilla, Develop Conference, Jul. 2007, Brighton; Develop07_Valient_DeferredRenderingInKillzone2.pdf (guerrilla-games.com), 55 pages.
Vezočnik, M. and Juric, MB., "Adaptive Inertial Sensor-Based Step Length Estimation Model" Sensors 2022, 22 (23), 9452; https://doi.org/10.3390/s22239452, 20 pages.
Wang, CY. et al., "YOLOv7: Trainable bag-of-freebies sets new state-of-the-art for real-time object detectors"; arXiv:2207.02696v1 [cs.CV] Jul. 6, 2022; 2207.02696.pdf (arxiv.org), 15 pages.
Wikipedia, "Deferred shading"; Deferred shading—Wikipedia; https://en.wikipedia.org/wiki/Deferred_shading, Retrieved on: Oct. 27, 2023, 8 pages.
Zhang, Y. and Huang, F., "Panoramic Visual SLAM Technology for Spherical Images" Sensors 2021, 21, 705. https://doi.org/10.3390/s21030705, 18 pages.
Zhao, Q. et al., "SPHORB: A Fast and Robust Binary Feature on the Sphere" International Journal of Computer Vision 113, 143-159 (2015), 6 pages.
Karakotta et al.; "360 degree Surface Regression with a Hyper-Sphere Loss"; 2019 International Conference of 3d Vision (3DV), pp. 258-268. (Year: 2019).

(56) References Cited

OTHER PUBLICATIONS

Non Final Office Action Issued in U.S. Appl. No. 18/501,738 Mailed Date: Feb. 29, 2024, 28 Pages.
Zhang et al.; "Advanced Progress Control of Infrastructure Construction Projects Using Terrestrial Laser Scanning Technology;" Oct. 12, 2020; MDPI infrastructures; pp. 1-18 (Year: 2020).

* cited by examiner

| World positions | Px | Py | Pz | - | 4xfloat |
|---|---|---|---|---|---|
| World surface normals | Nx | Ny | Nz | - | 4xfloat |
| Auxiliary data | BIM element ID | Depth | Is front-face of geometry? | - | 4xfloat |

Fig. 6

MONITORING PROGRESS OF OBJECT CONSTRUCTION

The present invention relates to a method for tracking progress of the construction of objects, in particular walls comprised in a building based on 3D digital representation. Building Information Modeling (BIM) may provide a digital representation of the physical and functional characteristics of a place, such as a building comprising walls and other objects.

BACKGROUND

Before construction of a building is initiated, it may be designed in 3D using BIM modelling tools such as Autodesk Revit, Trimble Tekla, or Graphisoft ArchiCAD. A 3D design consists typically of several individual files/models for multiple disciplines such as architect, structural engineering, mechanical, electrical, plumbing, etc., each managing different mechanical or functional sub-parts of the building, such as electrical wiring, plumbing, ventilation etc. Lots of other levels of details can also be part of the design process, such as safety, foundation, landscaping etc. Combining all these sub-models into a single model is referred to as the federated model. Here, a sub-model is referred to as a BIM model and the combined federated model is referred to as the actual BIM building.

The International patent application WO 2013/041101 with the title: "BIM and display of 3D models on client devices" discloses the calculation of 2D images from a 3D model, wherein the 2D images may be generated on a computer device and stored on a server for subsequent display on a client device.

The U.S. Pat. No. 9,070,216 B2 discloses a method for monitoring construction progress including storing in memory multiple unordered images obtained from photographs taken at a site, melding the multiple images to reconstruct a dense three-dimensional (3D) as-built point cloud model including merged pixels from the multiple images in 3D space of the site, rectifying and transforming the 3D as-built model to a site coordinate system existing within a 3D as-planned building information model, and overlaying the 3D as-built model with the 3D as-planned model for joint visualization thereof to display progress towards completion of a structure shown in the 3D as-planned model.

SUMMARY

There is a need to be able to track the construction of objects, in particular objects which are subject to several stages of processing, typically by different craftsmen with different expertise. Tracking objects, which are constructed in several stages at a site allows for improving trade coordination, time planning, and optimizing the use of materials and human resources.

There is a need for obtaining an overview of the construction of numerous objects at a construction site, in a cost-effective manner.

Monitoring the progress of work at a construction site is usually performed by visual inspection, which may be facilitated by recording images at the site.

Monitoring the construction of objects at a site from images recorded at a construction site and comparing to a 3D model is challenging, because the object may appear differently during multiple stages of construction, and further because a construction site typically comprises personnel and objects, such as devices and construction materials, which does not form part of the 3D model, thereby effectively representing noise for the analysis of the images.

According to an aspect of the invention, it concerns a method for monitoring the progress of the construction of at least one object at a construction site, wherein said object is constructed in multiple stages at said site, said method comprising the steps of:
  a. Providing a digital representation of a 3D model of at least part of said site, wherein said 3D model comprises a representation of said at least one object including the coordinates of said object with respect to said 3D model;
  said 3D model optionally comprising metadata;
  b. Capturing one or more images consisting of pixels at the site with a camera;
  c. Providing an image location and direction for each of said images allowing locating and orienting said images with respect to said 3D model;
  d. For each image location and direction rendering the 3D model into a virtual projection consisting of virtual pixels, such as an equirectangular projection, such as a cube map with six sides;
    wherein said virtual projection comprises for each virtual pixel:
      i. The coordinates of the rendered part of the 3D model;
      ii. The surface normal of the rendered part of the 3D model; and
      iii. Any BIM identification marker of the rendered part of the 3D model;
  e. Using at least one of said images to detect the presence of said at least one object or a part of said at least one object applying a machine learning model on said image, wherein the machine learning model has been trained to detect said object or a part of said at least one object;
  f. For each image wherein the presence of said object has been detected, identifying the stage of progress of construction of said at least one object applying a machine learning model on said image, wherein the machine learning model has been trained to recognize different stages of said multiple stages;
  g. Feeding the rendered projection into a digital processor, thereby allowing displaying or comparing the relevant part of the 3D model and the at least one image in the same format; and
  h. Presenting the stage of progress of the detected object with reference to the 3D model.

This allows a user of the system to get an overview of the progress of construction of objects, which have been identified in the images.

The expression "multiple stages" refers to at least two stages, such as in partial or completed form.

According to an aspect of the invention, it concerns a method for monitoring the progress of the construction of at least one object at a site, wherein said at least one object is constructed in multiple stages at said site, said method comprising the steps of:
  a. Providing a digital representation of a 3D model of at least part of said site, wherein said 3D model comprises a representation of said at least one object;
  b. Capturing one or more images at the site with a camera;
  c. Using said one or more images to detect the presence of said at least one object in partial or completed form;

d. Comparing the detected object with the 3D model to identifying the stage of progress of construction of said at least one object.

According to an aspect of the invention, it concerns a method for monitoring the progress of the construction of at least one object at a site, wherein said at least one object is constructed in multiple stages at said site, said method comprising the steps of:
  a. Providing a digital representation of a 3D model of at least part of said site, wherein said 3D model comprises a representation of said at least one object;
  b. Capturing one or more images at the site with a camera;
  c. Using said one or more images to detect the presence of said at least one object in any of said multiple stages;
  d. Identifying the stage of progress of construction of said at least one object using a machine learning model on said one or more images, wherein said machine learning model has been trained to recognize different stages of said multiple stages; and
  e. Comparing the identified stage of progress of construction of said at least one object with the 3D model.

According to another aspect of the invention, it concerns a method for monitoring the progress of the construction of at least one object, comprising:
  a. Providing a digital representation of a 3D model comprising said at least one object, said 3D model optionally comprising metadata;
  b. Capturing one or more images consisting of pixels at the site with a camera;
  c. Providing a location and a direction of said image;
  d. Rendering the 3D model into a virtual projection consisting of virtual pixels, such as an equirectangular projection, such as a cube map with six sides;
     wherein said virtual projection comprises for each virtual pixel:
       i. The coordinates of the rendered part of the 3D model;
       ii. The surface normal of the rendered part of the 3D model; and
       iii. Any BIM identification marker of the rendered part of the 3D model;
  e. Feeding said rendered projection into a digital processor, such as a CPU, thereby allowing displaying or comparing the relevant part of the 3D model and the image;
  f. Using a machine learning model to detect the presence of said at least one object in partial or completed form in the captured one or more images; and
  g. Comparing the detected at least one object with the 3D model to identify the stage of progress of construction of said at least one object.

According to an aspect of the invention, it concerns a method for monitoring the progress of the construction of objects, such as walls, at a site, comprising the steps of:
  a. Providing an digital representation of a 3D model;
  b. Capturing at least two images with a camera from different locations of said site;
  c. Identifying and storing information about the coordinates of said locations, supplemented with the direction of said camera for each image;
  d. Calculating the distance between the locations;
  e. Identifying any common points between said at least two images;
  f. Determining the coordinates of any identified common points by triangulation using the coordinates of said locations, the calculated distance between said locations, and the position of the identified common points in said at least two images; and
  g. For each identified common point adding a point to a point cloud representation at the coordinates determined by the triangulation;
  h. Using the generated point cloud representation to detect the presence of any objects, such as walls, in partial or completed form;
  i. Comparing the detected object with the 3D model to identifying the stage of progress of construction of said object.

FIGURES

Figure 3:
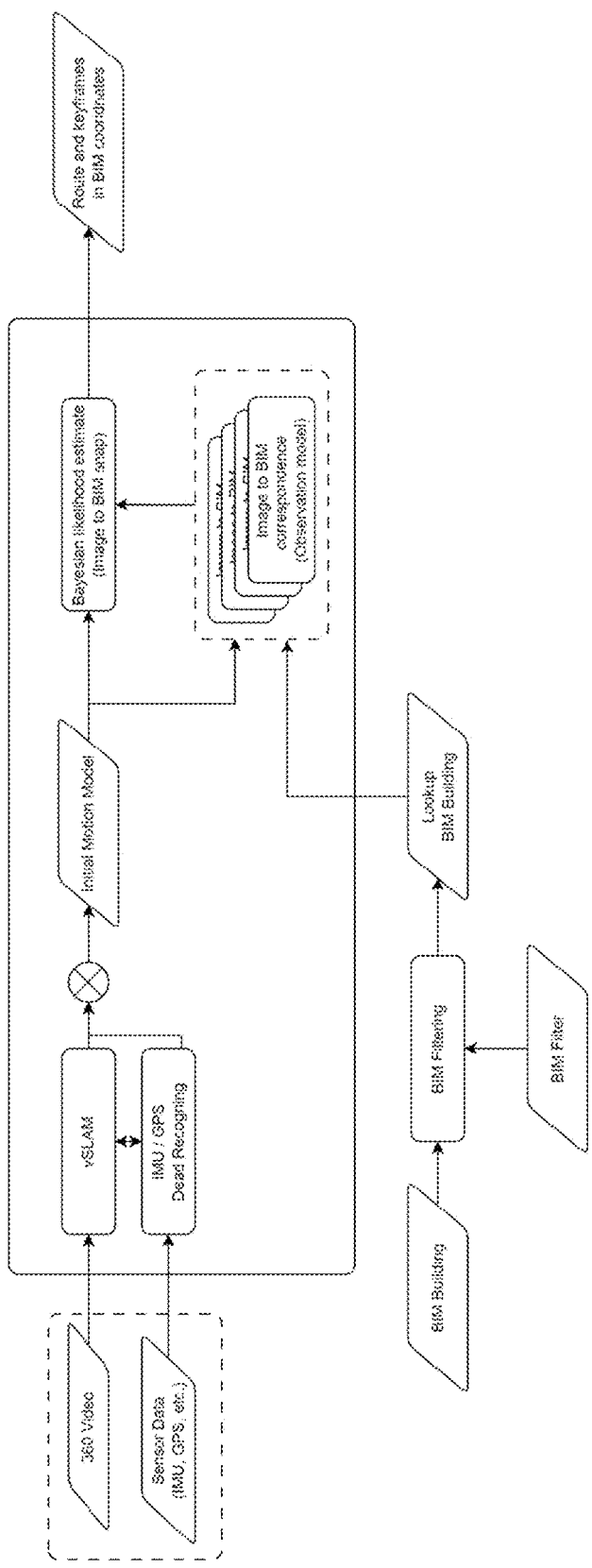

FIG. 3 schematically indicates processing steps to establish a route in the 3D model from images recorded with a camera.

Figure 4:
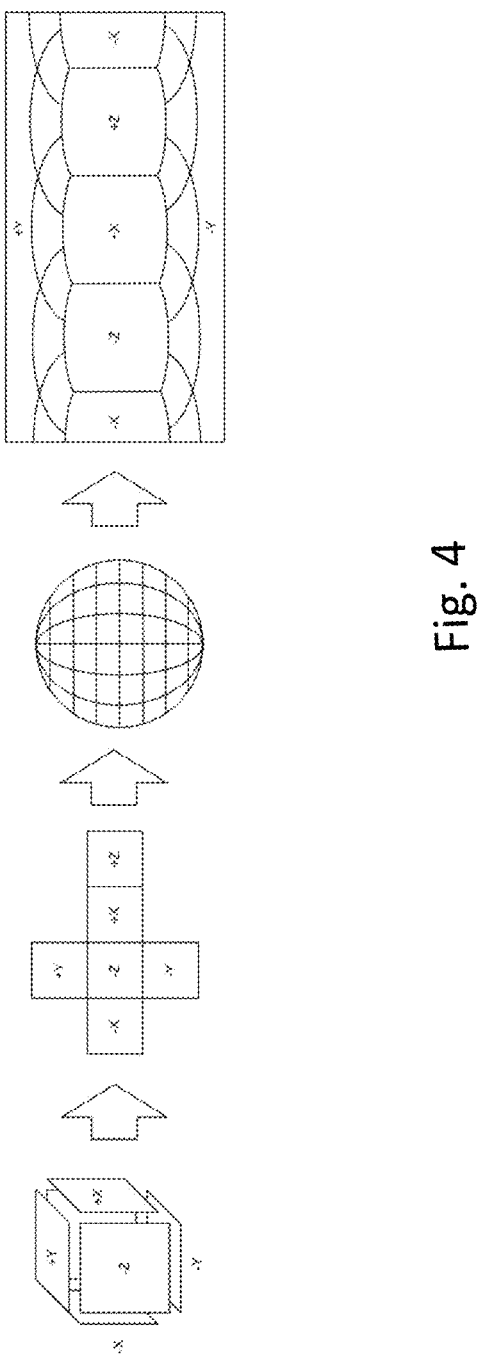

FIG. 4 indicates how an equirectangular projection may be made.

Figure 5:

FIG. 5 shows an image recorded at a construction site (left side) and a visual representation of a 3D BIM model at the same coordinates.

FIG. 6 shows an example of an element of a BIM buffer. Each BIM buffer consists of 3 render-targets. A render-target may have a resolution of 1000 times 1000 pixels. For each pixel there is an element, consisting of 3 parts. The first part comprises the world positions or x, y, and z coordinates. The second part comprises the surface normal, providing the orientation.

The third part comprises meta data (the BIM ID or BIM identification marker), the depth or distance from the observer or camera, and binary information indicating if the buffer element is facing the observer or camera or not.

Figure 7:
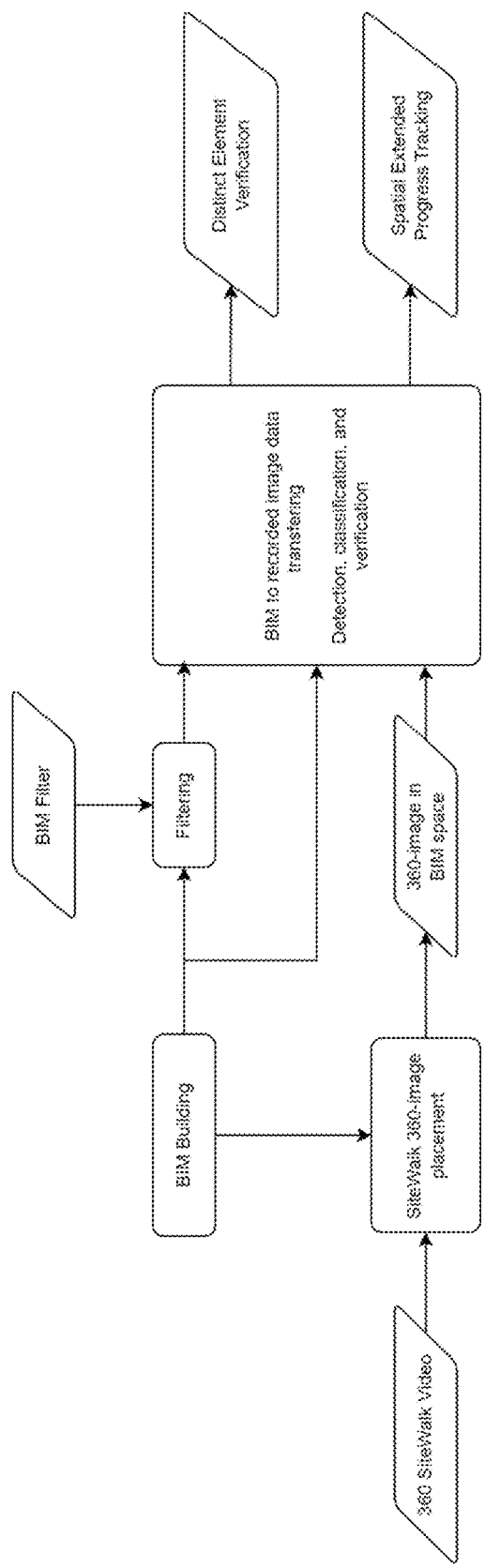

FIG. 7 shows how information from recorded images are processed to provide information about the presence of objects as well as information about the stage of progress of construction of objects. "SiteWalk" refers to obtaining images by walking through a building while filming with a camera, recording images as well as storing information about the coordinates and orientation of the images.

Figures 8A, 8B:
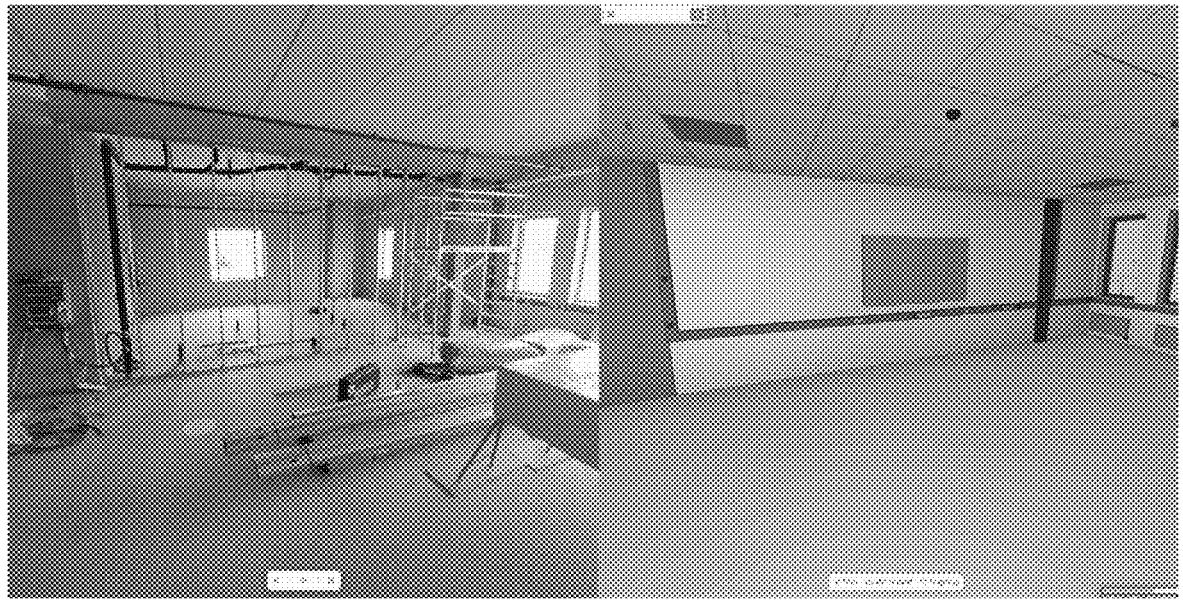
Figures 8C, 8D:

FIG. 8A shows an image from a construction site, and FIG. 8B a corresponding representation of the 3D model at the same coordinates. As emphasized in FIG. 8C, a wall is missing in the image, while it is indicated in FIG. 8D of the 3D model to be constructed.

Figure 9:
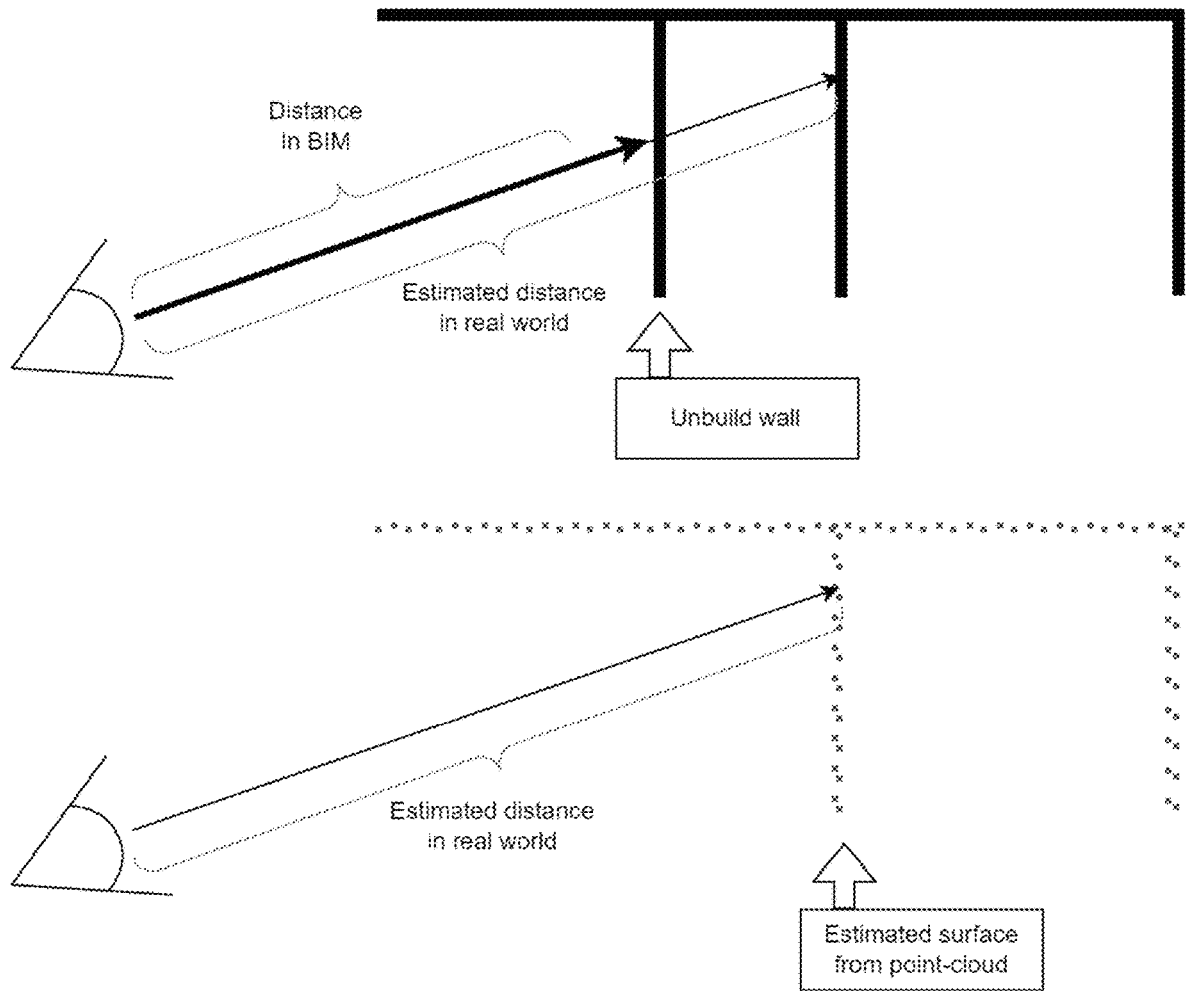

FIG. 9 is a schematic representation of the use of a point cloud to estimate distances to identify the presence of a specific wall.

Figure 10A:
Figure 10B:
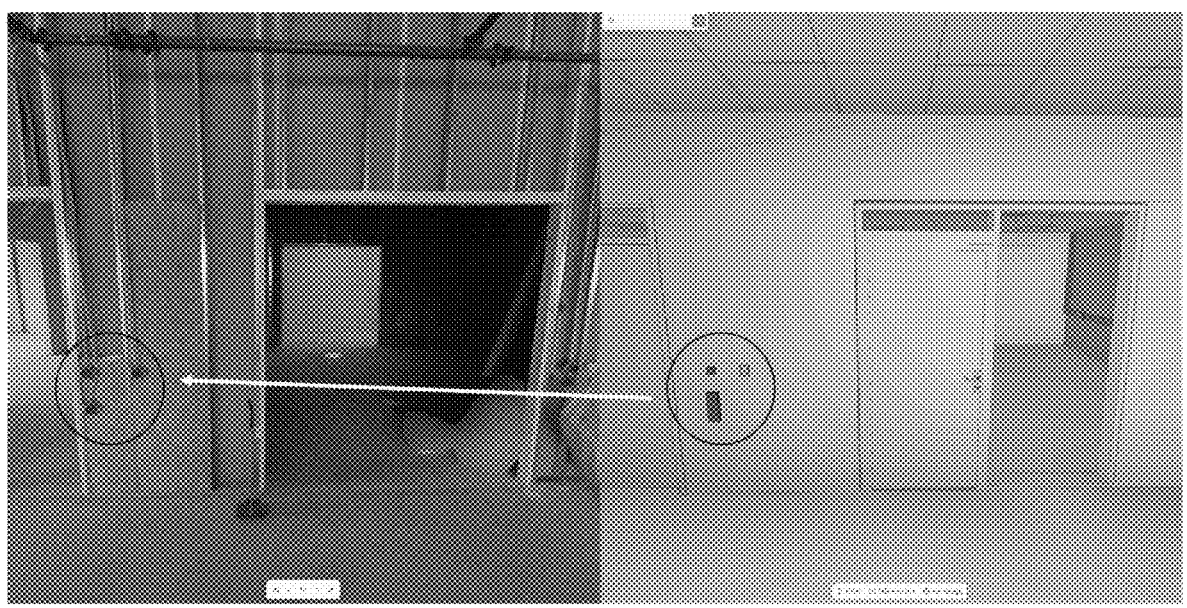

FIG. 10 shows an image (left) captured by a camera and a representation of the corresponding part of the 3D model (right) at the same coordinates and with the same direction or orientation. Various objects of the image has been identified in the 3D model.

Figure 11:

FIG. 11 shows four images recorded at the same coordinates at a construction site. A wall is being constructed, and the four stages are framing (upper left), framing with insulation (upper right), plasterboard (lower left), and finalized (lower right). Also shown in the images are various construction materials and devices.

Figure 12:
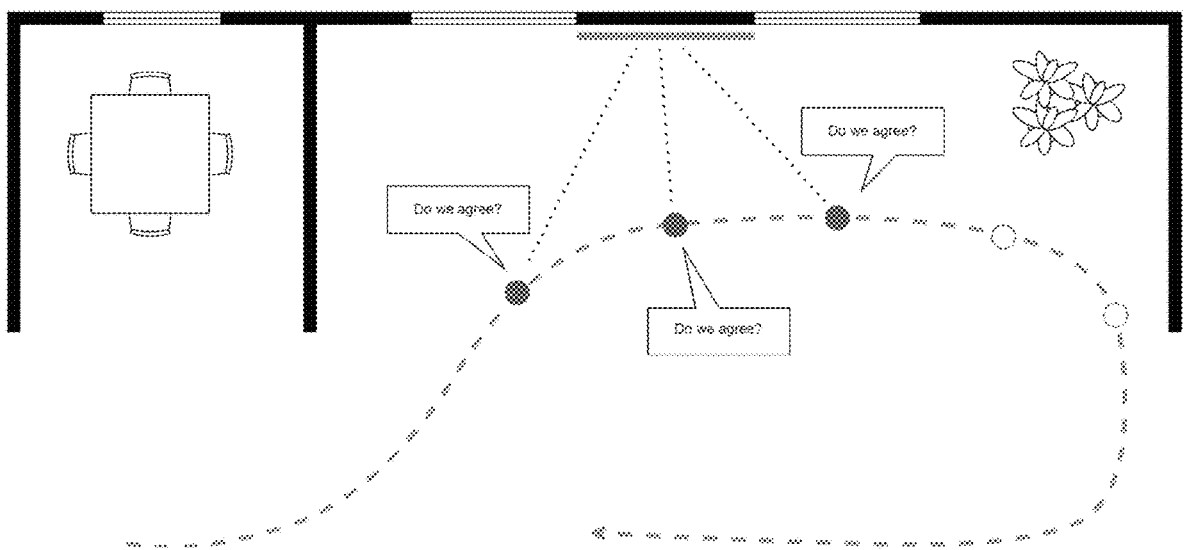

FIG. 12 shows a route a camera has been carried with reference to a two-dimensional representation of a 3D model. Several images may be captured and processed, and the information from the images and coordinates combined to provide a consensus based on probabilities of the presence of an object estimated from the images.

Figure 13A:
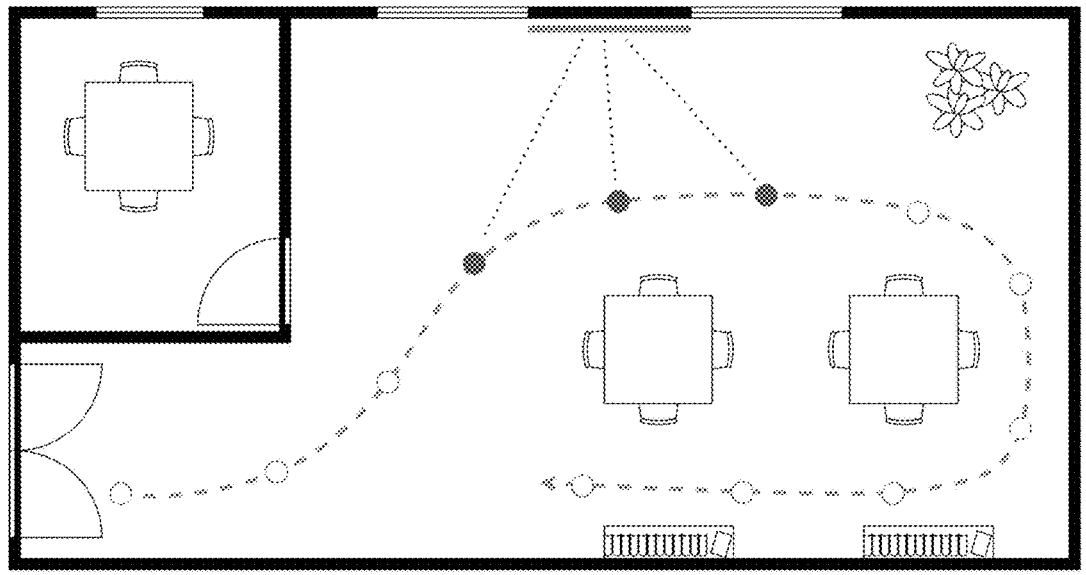
Figure 13B:
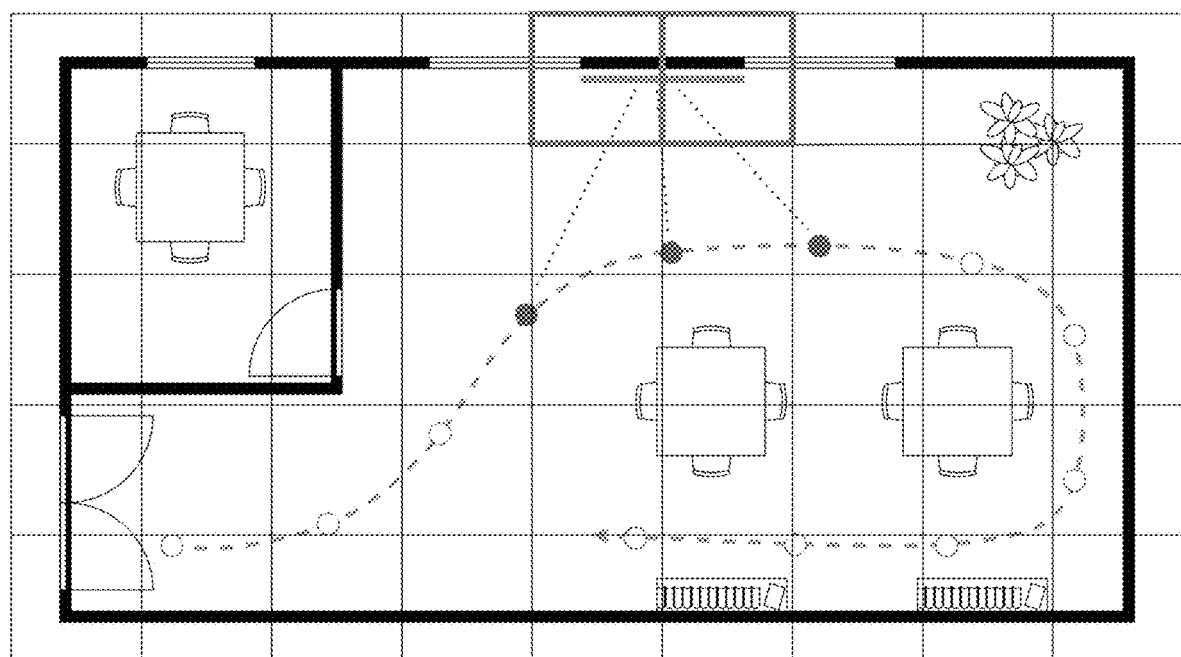

FIGS. 13A and 13B is a schematic representation of a route a camera has been carried with reference to a two-dimensional representation of a 3D model. Several images may be captured and processed, and the information from the images and coordinates combined to provide a consensus based on probabilities of the presence of an object estimated from the images. To speed up the process of object identification, the space may be divided into subspaces, also referred to as voxels, wherein said voxels have a length, a height and a depth.

Figure 14:
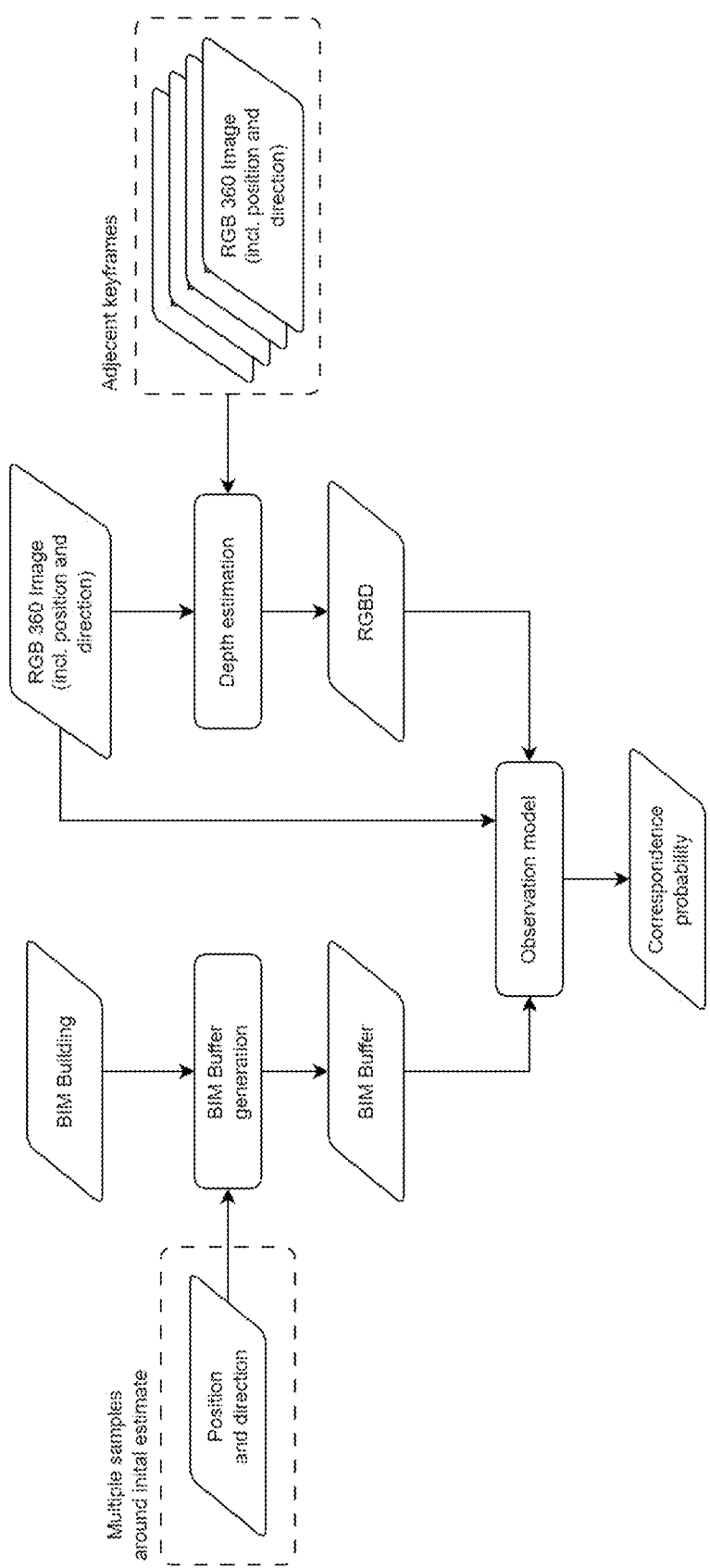

FIG. 14 shows a schematic representation of how the 3D model, a BIM building, and the images captured by the camera are processed. The position and direction (pose) of the images, here RGB 360 images, is used as an initial guess of the viewpoint for the BIM building.

Figure 15:
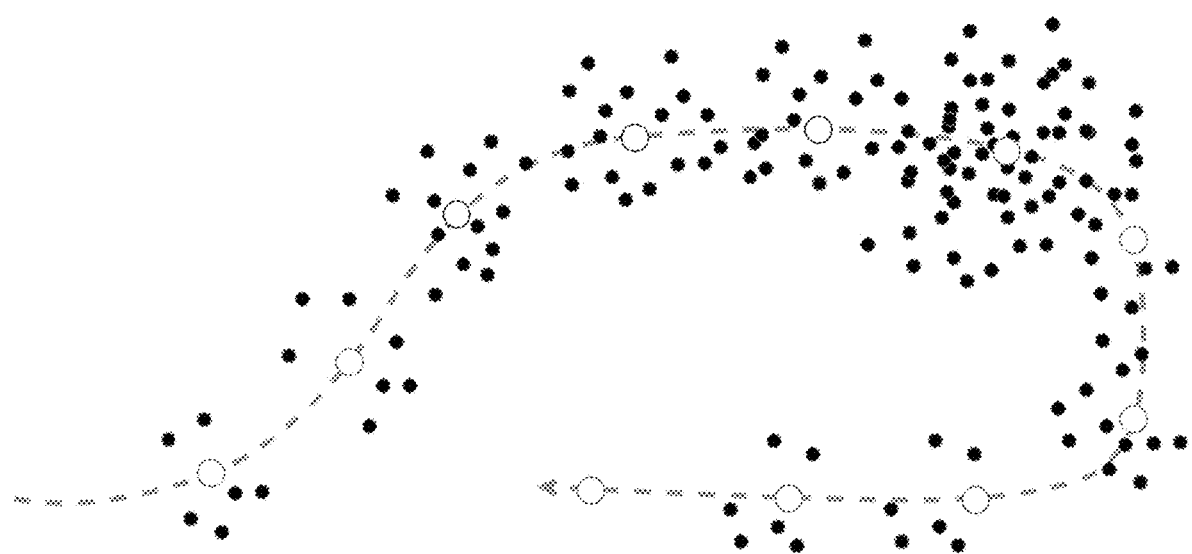

FIG. 15 shows a route a camera has been carried with reference to a two-dimensional representation of a 3D model. Several images may be captured and processed, here marked with open dots for the measured or initially estimated coordinates. For each of these alternative positions, marked with black dots, are used to generate expected images based on the 3D model. Comparing these expected images with the captured images, improved coordinates may be obtained.

Figure 16:
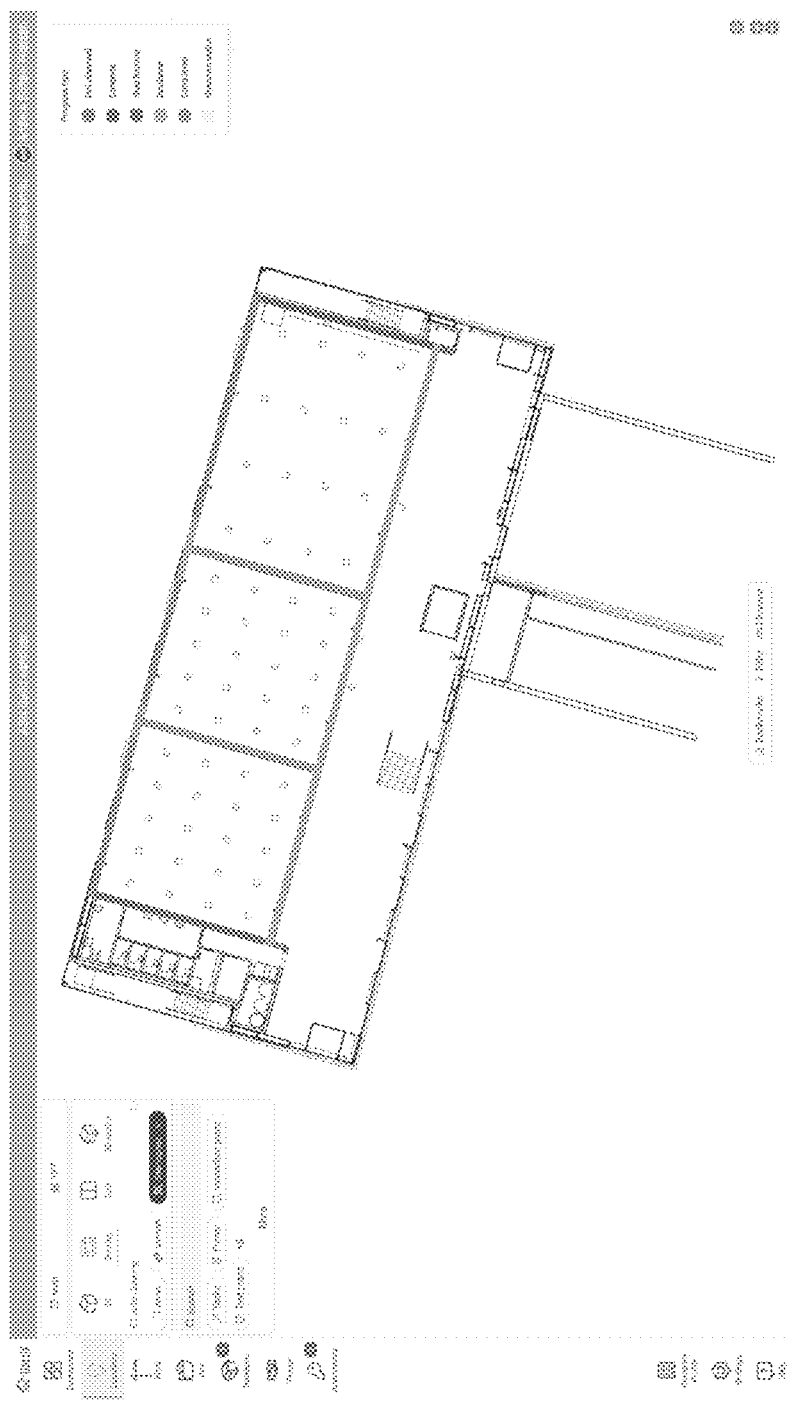

FIG. 16 shows a two-dimensional plan of a 3D model. Different colors (not shown) may be applied to the walls to indicate the stage of construction of the walls.

Figure 17:
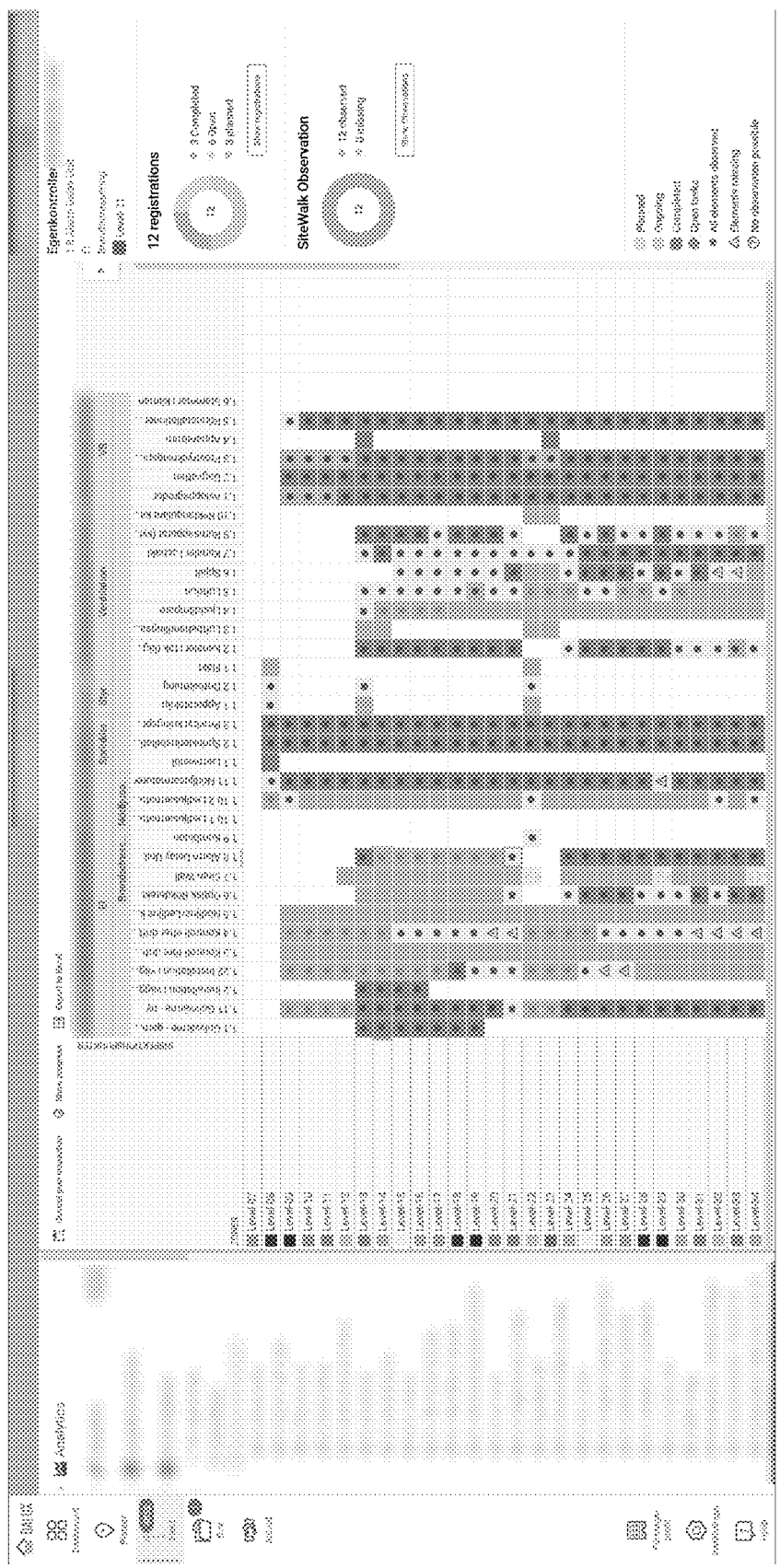

FIG. 17 shows an overview of the stage of construction of various objects in a multi-story building.

DETAILED DISCLOSURE

According to embodiments, the present invention concerns the subject-matter of the claims as well as combinations of the claims.

A "digital representation of a 3D model" or a "3D model" refers to a BIM model, which provides a digital representation of the physical and/or functional characteristics of a place, such as a building comprising walls and other objects, and may comprise at least one coordinate system for the model.

The term "image" or "images" refers to digital images or images which may be provided, digitalized, or processed in digital form. As an example, it may be a non-digital photograph which is scanned to provide the digital form.

Artificial intelligence (AI) is the intelligence of machines or software, as opposed to the intelligence of humans or animals. Here, AI refers to the application of a machine learning model to identify elements or objects.

A 360 degrees camera or an omnidirectional camera covers the entire sphere or at least a full circle in the horizontal plane. A 360 degrees camera may be replaced by one or more cameras providing contributing parts to a full 360 degrees image, such as a photograph or video.

According to an embodiment of the invention, it concerns a method for monitoring the progress of the construction of at least one object at a construction site, wherein said object is constructed in multiple stages at said site, said method comprising the steps of:

a. Providing a digital representation of a 3D model of at least part of said site, wherein said 3D model comprises a representation of said at least one object including the coordinates of said object with respect to said 3D model;

said 3D model optionally comprising metadata;

b. Capturing one or more images consisting of pixels at the site with a camera;

c. Providing an image location and direction for each of said images allowing locating and orienting said images with respect to said 3D model;

d. For each image location and direction rendering the 3D model into a virtual projection consisting of virtual pixels, such as an equirectangular projection, such as a cube map with six sides;

wherein said virtual projection comprises for each virtual pixel:

i. The coordinates of the rendered part of the 3D model;

ii. The surface normal of the rendered part of the 3D model; and iii. Any BIM identification marker of the rendered part of the 3D model;

e. Using at least one of said images to detect the presence of said at least one object applying a machine learning model on said image, wherein the machine learning model has been trained to detect said object;

f. For each image wherein the presence of said object has been detected, identifying the stage of progress of construction of said at least one object applying a machine learning model on said image, wherein the machine learning model has been trained to recognize different stages of said multiple stages;

g. Feeding the rendered projection into a digital processor, thereby allowing displaying or comparing the relevant part of the 3D model and the at least one image in the same format; and h. Presenting the stage of progress of the detected object with reference to the 3D model.

The 3D or BIM model provides information about what should be built, allowing comparing stage and progress with the design (the BIM model), providing a precise estimate towards 100% progress.

Metadata refers to a collection of properties (key/value pairs), assigned to all Building Information Modeling (BIM) elements in a BIM building or model. Metadata may also be referred to as BIM identification markers.

Virtual pixels refer to pixels which are not from images captured by a camera but generated by a digital processor.

According to an embodiment, the invention concerns the method, wherein said steps e. and/or f. is performed by dividing each of said one or more images into segments, detecting the presence of said object in each segment and/or identifying the stage of progress of any part of said object present in each of said segments, and combining the results from the segments to obtain a conclusion concerning the stage of construction of said object. In this embodiment, training the machine learning model is simplified, but context is lost.

The term "segment" may also be referred to as "patch". Preferably, a segment or patch is a square cut-out in world space or the 3D model. The size is preferably defined in world space or the 3D model. Thus, the shape and size will in general vary in the images and generated projections and in the IBM buffer, depending on the perspective. Thus, on the captured images the size of the segment depends on the distance to the object or feature when the size is defined in world space or the 3D model. As an example, upon looking down the side of a wall an acute angle, the segments/patches will be smaller and smaller the further they are from the observer or camera. This will ensure the same amount of context inside each segment in the world space or 3D model. This may be implemented using the BIM buffer with the distance information. The BIM-buffer allows performing operations such as segment distribution in the screen space. It has been discovered that this approach may simplify processing as compared to working with the world space distribution. In addition, it has been discovered that this approach allows processing without having any prior knowledge about the geometry of objects for which the stage of construction should be identified. This makes the process far more robust across different BIM buildings which may have different underlaying geometric characteristics.

According to an embodiment, the invention concerns the method, wherein probabilities are assigned to each of said segments, indicating the likelihood said object is present in each segment, and/or the likelihood of each stage of progress of said object in said segment, followed by making a conclusion of the likely stage of progress of said object based on said assigned probabilities.

According to an embodiment, the invention concerns the method, wherein said steps e. and/or f. is performed by detecting the presence of said object in each of said images and/or identifying the stage of progress of said object present in each of said images without dividing the images into segments.

According to an embodiment, the invention concerns the method, wherein a final conclusion concerning the stage of construction of said object is obtained by combining the results from A: the method, wherein said steps e. and/or f. is performed by dividing each of said one or more images into segments, detecting the presence of said object in each segment and/or identifying the stage of progress of any part of said object present in each of said segments, and combining the results from the segments to obtain a conclusion concerning the stage of construction of said object; with the results from B: the method, wherein said steps e. and/or f. is performed by detecting the presence of said object in each of said images and/or identifying the stage of progress of said object present in each of said images without dividing the images into segments.

According to an embodiment, the invention concerns the method, wherein step b. comprises capturing at least two images with a camera from different locations of said site; and the method further comprises steps of localizing the detected objects comprising:
  i. Calculating the distance between the different locations;
  ii. Identifying any common features apparent in said at least two images;
  iii. Determining the coordinates of any identified common features by triangulation using the coordinates of said locations, the calculated distance between said locations, the direction of capture of said images, and the position of the identified common features in said at least two images;
  iv. For each identified common feature adding a point to a point cloud representation at the coordinates determined by the triangulation;
  v. Aligning the point cloud representation with the 3D model; and
  vi. Using the generated point cloud representation to confirm the presence of any detected objects with reference to the 3D model.

According to an embodiment, the invention concerns a method for monitoring the progress of the construction of at least one object at a site, wherein said at least one object is constructed in multiple stages at said site, said method comprising the steps of:
  a. Providing a digital representation of a 3D model of at least part of said site, wherein said 3D model comprises a representation of said at least one object;
  b. Capturing one or more images at the site with a camera;
  c. Using said one or more images to detect the presence of said at least one object in partial or completed form;
  d. Comparing the detected object with the 3D model to identifying the stage of progress of construction of said at least one object.

According to an embodiment, the invention concerns the method, wherein said object is selected among a wall, a panel, an air-vent and a cable-tray.

According to an embodiment, the invention concerns the method, wherein said object is a wall, and the stage is selected among not observed, concrete, stud framing, framing with insulation, plasterboard, painted, and finalized. The stages may depend on the type of building and/or the local building customs and/or regulations.

According to an embodiment, the invention concerns the method, wherein step d. is implemented by a machine learning model, which has been trained to recognize the different stages.

According to an embodiment, the invention concerns the method, further comprising providing information about the region of the world of the site, allowing adaptation to local traditions and regulations concerning the construction of said at least one object.

According to an embodiment, the invention concerns the method, further comprising summarizing the stage of progress of construction of said object as output to a user.

According to an embodiment, the invention concerns the method, further comprising identifying any poorly or faulty constructed objects.

According to an embodiment, the invention concerns the method, wherein said camera is a 360 degrees camera.

According to an embodiment, the invention concerns the method, wherein said one or more images are one or more photographs and/or videoframes.

According to an embodiment, the invention concerns the method, wherein a video is captured, providing videoframes.

According to an embodiment, the invention concerns the method, wherein images from said camera are collected together with input from motion sensors detecting the motion of said camera.

According to an embodiment, the invention concerns the method, wherein a said camera is carried and moved by a drone or a person.

According to an embodiment, the invention concerns the method, wherein a user controlling said camera provides input of the start location and/or end location of the recording of one or more images with said camera.

According to an embodiment, the invention further comprises comparing the identified objects with the 3D model to identify objects of the 3D model which may occur in partly finished form, to identify whether any of said objects occur as partly finished objects or finished objects, and/or in which state any partly finished objects are present.

According to an embodiment, the invention concerns the method, comprising a step of generating output which is readable on a mobile device, such as a mobile phone or tablet computer, to show missing, superfluous, misplaced objects, wrong and/or wrongly installed objects of the 3D model.

According to an embodiment, the invention concerns the method, comprising a step of generating output which is readable on a browser running on a computer to provide a report showing missing, superfluous, misplaced objects, wrong and/or wrongly installed objects of the 3D model.

According to an embodiment, the invention concerns the method, comprising a step of applying a filter to show missing, superfluous, partly finished and/or misplaced objects and/or poorly or faulty constructed objects of the 3D model, wherein said filter is selectable from one or more categories, e.g. by a user of the method.

The selection of one or more categories may be implemented by the application of a BIM filter.

According to an embodiment, the invention concerns the method, wherein the categories are selected among walls, windows, doors, ventilation tubes, ventilation vents, water tubes, electrical installations, and/or fire alert systems. Other categories may potentially be defined by a user of the method.

According to an embodiment, the invention concerns the method, wherein said 3D model is a BIM building.

According to an embodiment, the invention concerns the method, wherein a user may apply a filter to a federated model comprising all the information of the said 3D model to provide a simplified model, preferably selected among an architectural model, a structural model, a mechanical model, an electrical model, a plumbing model, a ventilation model and a fire protection model.

According to an embodiment, the invention concerns the method, wherein more than one recording is made with a camera at said site, and said more than one recording is saved, allowing subsequent easier identification of the origin of any faulty constructed objects.

A general contractor may use this information to identify at which stage a mistake was made during construction, facilitating repair. This embodiment may also provide documentation on the progress of the work.

According to an embodiment, the invention concerns the method, wherein tracking site progress comprises the monitoring of the progress of a building or construction at said site.

According to an embodiment, the invention concerns the method, wherein tracking site progress comprises the monitoring of the progress of the construction of infrastructure, such as infrastructure selected among roads, tunnels, bridges, railways, stations, and electrical grids.

According to an embodiment, the invention concerns the method, used for quality control of the work of one or more contractors and/or craftsmen.

Currently, check lists may be used to verify that installations are completed. The present invention allows automation of filling out check lists.

According to an embodiment, the invention concerns the method, used by a contractor or craftsman to show the progress of a task. This embodiment allows the creation of detailed progress reports and may as well provide a sanity check of a progress report provided by a contractor or subcontractor.

According to an embodiment, the invention concerns the method, wherein quantities of objects are summarized, allowing correlation with expected pace, budgets, supply chain and/or detection of waste or theft at the site.

According to an embodiment, the invention concerns the method, wherein the summarized quantities of objects are used for invoicing, e.g. by contractors, subcontractors, craftsmen or suppliers.

According to an embodiment, the invention concerns a method for tracking site progress comprising:
a. Providing a digital representation of a 3D model comprising a coordinate system of at least part of the site;
b. Capturing one or more images at the site with a camera;
c. Providing a measured and/or estimated coordinate of the site of recording of said image, supplemented with the direction of the camera for said image;
d. Transferring the measured and/or estimated coordinate to the coordinate system of the 3D model, to obtain a first estimated position;
e. Generating an expected image of the 3D model at the first estimated position;
f. Comparing the expected image with the recorded image; and
g. Fitting the expected image to the recorded image to obtain an improved estimated position.
h. Using machine learning model to identify objects of the 3D model in said captured images; and
i. Comparing the identified objects with the 3D model to conclude which objects of the 3D model are missing at the site.

According to an embodiment, the invention concerns the method, for placing multiple images recorded with a camera at different positions individually in the coordinate system of the 3D model, said method further comprising:

Using a Simultaneous Localization and Mapping (SLAM) system to provide a first estimated route indicating the positions of said multiple images; Converting said first estimated route to first estimated coordinates in the BIM model; Improving the accuracy of said first estimated coordinates using a Bayesian likelihood estimate, wherein most likely matches between the BIM model and the images contributes to the final triangulation of the actual position of said images.

According to an embodiment, the invention concerns the method, wherein the SLAM system combines visual input from said images with Inertial Measurement Unit (IMU) and/or Global Positioning System (GPS) sensor data.

According to an embodiment, the invention concerns a method for monitoring the progress of the construction of at least one object, comprising:
a. Providing a digital representation of a 3D model comprising said at least one object, said 3D model optionally comprising metadata;
b. Capturing one or more images consisting of pixels at the site with a camera;
c. Providing a location and a direction of said image;
d. Rendering the 3D model into a virtual projection consisting of virtual pixels, such as an equirectangular projection, such as a cube map with six sides;
   wherein said virtual projection comprises for each virtual pixel:
   i. The coordinates of the rendered part of the 3D model;
   ii. The surface normal of the rendered part of the 3D model; and
   iii. Any BIM identification marker of the rendered part of the 3D model;
e. Feeding said rendered projection into a digital processor, such as a CPU, thereby allowing displaying or comparing the relevant part of the 3D model and the image;
f. Using a machine learning model to detect the presence of said at least one object in partial or completed form in the captured one or more images; and g. Comparing the detected at least one object with the 3D model to identify the stage of progress of construction of said at least one object.

Metadata may be defined by a user as an object of interest for identification of said object in the 3D model.

The surface normal may be used for indicating if the surface is hardly visible and thus contributes little to a generated visual representation.

The rendered projection which is fed into a digital processer does not need to have the same resolution as the image. Transferring data between the domain of the projection and the image is suitable done using normalized coordinates ($[0, \ldots 1]$), thereby providing a common framework. This allows re-sizing the BIM buffer or projection according to performance requirements.

According to an embodiment, the invention concerns the method, wherein said virtual projection further comprises for each virtual pixel the distance from the rendered part of the 3D BIM to the location. This distance is used for depth validation. If the distance in the BIM model is the same distance as the estimated distance in the recorded image, the probability of observing the same element is significantly increased.

According to an embodiment, the invention concerns the method, wherein said virtual projection further comprises for each virtual pixel binary information indicating if the rendered part of the 3D model faces the camera. This allows rejecting faulty BIM buffers where the initial position of the observer is placed inside walls or other geometric objects.

The binary information may also be used for speeding up calculations. The binary information may be deduced or calculated from the surface normal, or depending on the BIM model left out as the BIM model may be constructed so that parts not facing the camera are not shown. In this kind of BIM model, if a surface does not face the camera, it might not be relevant data for calculating the perceived image.

According to an embodiment, the invention concerns a method for monitoring the progress of the construction of objects, such as walls, at a site, comprising the steps of:
  a. Providing an digital representation of a 3D model;
  b. Capturing at least two images with a camera from different locations of said site;
  c. Identifying and storing information about the coordinates of said locations, supplemented with the direction of said camera for each image;
  d. Calculating the distance between the locations;
  e. Identifying any common points between said at least two images;
  f. Determining the coordinates of any identified common points by triangulation using the coordinates of said locations, the calculated distance between said locations, and the position of the identified common points in said at least two images; and
  g. For each identified common point adding a point to a point cloud representation at the coordinates determined by the triangulation;
  h. Using the generated point cloud representation to detect the presence of any objects, such as walls, in partial or completed form;
  i. Comparing the detected object with the 3D model to identifying the stage of progress of construction of said object.

For triangulation, measured, estimated or calculated angles between said locations may be used in the calculation of distances.

The final generated point cloud representation should preferably be sufficiently populated to provide a user with a perceived view showing key features such as walls and other objects of the 3D model.

According to an embodiment, the invention concerns the method, wherein said identification of any common points between said at least two images is performed by one or more methods selected among identifying common features in the images, and/or using a machine learning model on individual images and/or multiple images.

Such methods are generally known as part of photogrammetry. Applying a machine learning model on the recorded individual images may be used to estimate distances.

According to an embodiment, the invention concerns the method, wherein the identification of common features in different images followed by triangulation to estimate distances are combined with the estimation of distances by using a machine learning model on individual images, to obtain improved distance estimates.

According to an embodiment, the invention concerns the method, for BIM matching by distance filtering, comprising comparing the 3D model with the point cloud and identifying features of the 3D model in the point cloud by comparing the estimated distances to the camera as well as calculated position of the features in the images.

According to an embodiment, the invention concerns a method, wherein observations from several positions are combined into a point cloud. Points in the point cloud are stored in a occupancy grid, allowing for distance lookup from any location in the BIM coordinate system.

According to an embodiment, the invention concerns the method, further comprising:
  i. Subdividing the space of the 3D model into voxels, wherein said voxels have a length, a height and a depth, and wherein said voxels are smaller than or equal to the size of said at least one object;
  ii. Using the 3D model to determine which of said voxels may contribute at least part of said at least one object, to obtain a set of contributing voxels;
  iii. For each of said contributing voxels (ii.) determining the stage of progress of construction of the part of said at least one object within said contributing voxel by comparing with the results obtained from step f.;

Feeding the results (iii.) from the set of contributing voxels into a consensus based voting system to identify the stage of progress of construction of said at least one object. This embodiment may increase processing speed considerably.

According to an embodiment, the invention concerns the method, comprising visually presenting (i) the 3D model, and/or (ii) the one or more images, and optionally (iii) any detected objects and the progress of construction of said objects, by one or more of the following:
  I. Visual representations of (i) the 3D model with the corresponding (ii) image side by side, and optionally (iii) any detected objects and the progress of construction of said objects;
  II. A generated composite image of (i) and (ii), and optionally (iii) any detected objects and the progress of construction of said objects, wherein the transparency of (i) and/or (ii) may be toggled by a user;
  III. The images (ii) and (iii) any detected objects and the progress of construction of said objects;
  IV. A two-dimensional floor plan providing information about (iii) any detected objects and the progress of construction of said objects; and/or V. A summary report comprising information about and (iii) any detected objects and the progress of construction of said objects.

Here, (ii) will represent real world images, which may be compared with the model images with the present embodiment.

According to an embodiment, the invention concerns a system configured to perform steps comprising any of the steps of the method claims or embodiments, such as selected among:
  i. Steps a, d, e, f, g, and h of claim 1; and
  ii. Any of claims 2-18.

In some embodiments, the system is capable of executing a computer program product embodied in a tangible computer-readable storage medium to execute a computer process. As used herein, "tangible computer-readable storage media" includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium, such as non-transitory computer-readable storage medium, that can be used to store the desired information and that can accessed by a computer. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal.

Data and program files may be input to the computer system, which reads the files and executes the programs using one or more processors. Some of the elements of the computer system include a processor (e.g., having an input/output (I/O) section), a Central Processing Unit (CPU), and a memory. There may be one or more processors in the system, such that the processor comprises a single CPU or a plurality of CPUs. The processors may be single core or multi-core processors.

The computing system may be a conventional computer, a distributed computer, or any other type of computer. The described technology is optionally implemented in software (modules) loaded in memory, a storage unit, and/or communicated via a wired or wireless network link on a carrier signal (e.g., Ethernet, 3G wireless, 6G wireless, LTE (Long Term Evolution)) thereby transforming the computing system to a special purpose machine for implementing the described operations.

The I/O section may be connected to one or more user-interface devices (e.g., a keyboard, a touch-screen display unit, etc.) or a storage unit. Computer program products containing mechanisms to effectuate the systems and methods in accordance with the described technology may reside in the memory or on the storage unit of such a computer system.

A communication interface is capable of connecting the computer system to a network via the network link, through which the computer system can receive instructions and data embodied in a carrier wave. When used in local area networking (LAN) environment, the computing system is connected (by wired connection or wirelessly) to a local network through the communication interface, which is one type of communications device. When used in a wide-area-networking (WAN) environment, the computing system typically includes a modem, a network adapter, or any other type of communications device for establishing communications over the wide area network. In a networked environment, program modules depicted relative to the computing system or portions thereof, may be stored in a remote memory storage device. It is appreciated that the network connections shown are examples of communications devices for and other means of establishing a communications link between the computers may be used.

One or more relational databases storing data used in comparing different measurements may be stored in the disc storage unit or other storage locations accessible by the computer system. In addition, the computer system may utilize a variety of online analytical processing tools to mine and process data from the databases.

In addition, any or all of the module(s) may be stored in the memory and/or the storage unit and executed by the processor. In various implementations, aspects of processors and storage may be integrated together into one or more hardware logic components. Such hardware-logic components may include field-programmable gate arrays (FPGAs), program- and application-specific integrated circuits (PA-SIC/ASICs), program- and application-specific standard products (PSSP/ASSPs), system-on-a-chip (SOC), and complex programmable logic devices (CPLDs), for example.

According to an embodiment, the invention concerns a non-transitory computer-readable storage medium storing executable instructions that, when executed by a hardware processor, cause the hardware processor to perform steps comprising any of the steps of the method claims or embodiments, such as selected among:
  i. Steps a, d, e, f, g, and h of claim 1; and
  ii. Any of claims 2-18.

According to an embodiment, the invention concerns a computer program comprising program code means for performing any of the steps of any one of the method claims or embodiments, when said program is run on a computer, such as selected among:
  i. Steps a, d, e, f, g, and h of claim 1; and
  ii. Any of claims 2-18.

According to an embodiment, the invention concerns a computer program product comprising program code means stored on a computer readable medium for performing any of the steps of any one of the method claims or embodiments, when said program product is run on a computer, such as selected among:
  i. Steps a, d, e, f, g, and h of claim 1; and
  ii. Any of claims 2-18.

Any and all cited references are incorporated by reference.

The accompanying Figures and Examples are provided to explain rather than limit the present invention. It will be clear to the person skilled in the art that aspects, embodiments, claims and any items of the present invention may be combined.

EXAMPLES

A 360 degree video may be used to provide an extensive and thorough documentation of the state and progress of a construction site based on a 3D BIM model, i.e. a 3D model based on BIM data. 3D BIM models have replaced the use of 2D CAD with tools like AutoCAD.

Presently, buildings are modelled in 3D using CAD tools like Autodesk Revit and Graphisoft ArchiCAD.

Creating such 3D BIM models usually require many different trades such as architects, structural engineers, mechanical engineers, each managing different mechanical sub-parts of the building, such as electrical wiring, plumbing, ventilation etc. Lots of other levels of details can also be part of the design process, such as safety, foundation, landscaping etc.

Each of the above trades normally work on each or their part of the BIM model individually. Combining all these sub-models into a single model is called the federated model or simply the 3D model. Here, the combined federated model is referred to as the BIM building or the 3D model.

Figure 1:
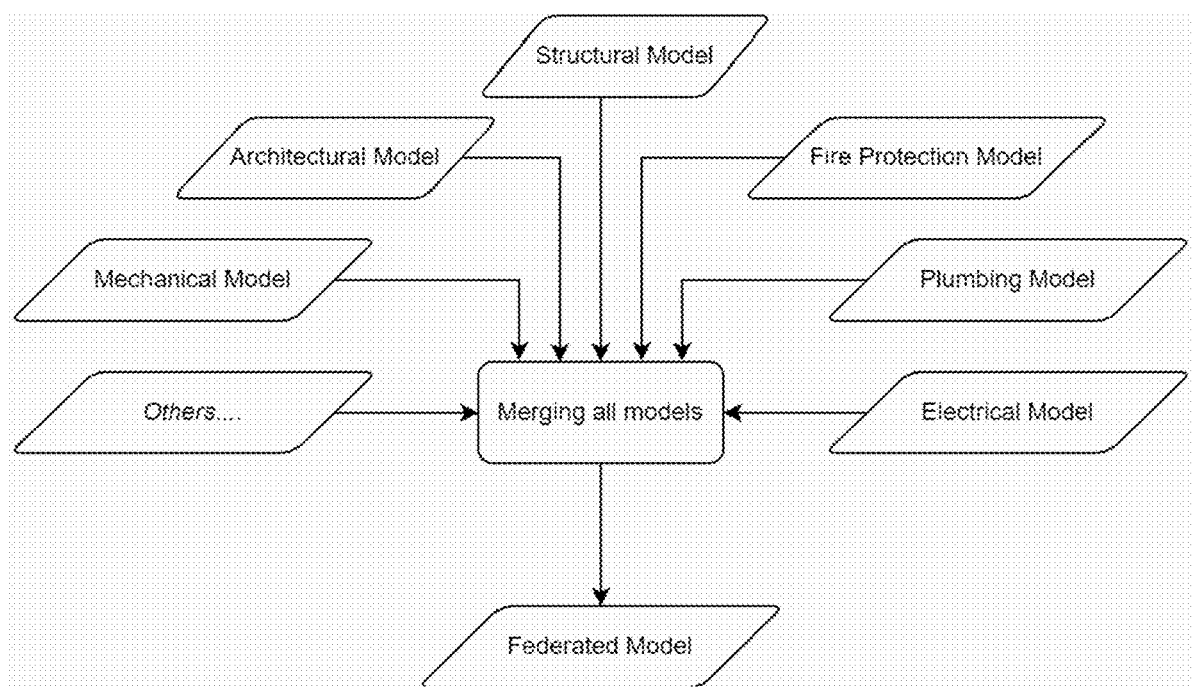
FIG. 1 is a schematic representation showing a federated model comprising elements from an electrical model, a plumbing model, a fire protection model, structural model, an architectural model, a mechanical model, and optionally other models.

FIG. 1 is a schematic representation showing a federated model comprising elements from an electrical model, a plumbing model, a fire protection model, structural model, an architectural model, a mechanical model, and optionally other models.

Work on the sub-models is usually done in parallel. Sometimes all the building-models are synced up and a snapshot of the federated model may be created. This may be done with a server, which tracks and manages the 3D model.

Image Recording at Construction Site

At a construction site, wherein a building is under construction based on a BIM model, the present invention may track the progress of the building by the following steps. 360 degrees images are recorded of the building at the site by walking though the building with a camera recording images. When photo documentation has been recorded and located in the building various Computer Vision based applications can be executed to automatically track construction progress, count, verify elements, and provide temporal insights, if such are present in the BIM model. All such automatic insight can be used to assist and notify general contractors about the state of the construction site and reduce/assist a lot of manual inspection labour, resolve later issues faster, and potentially avoid demolition and rework.

Figure 2:
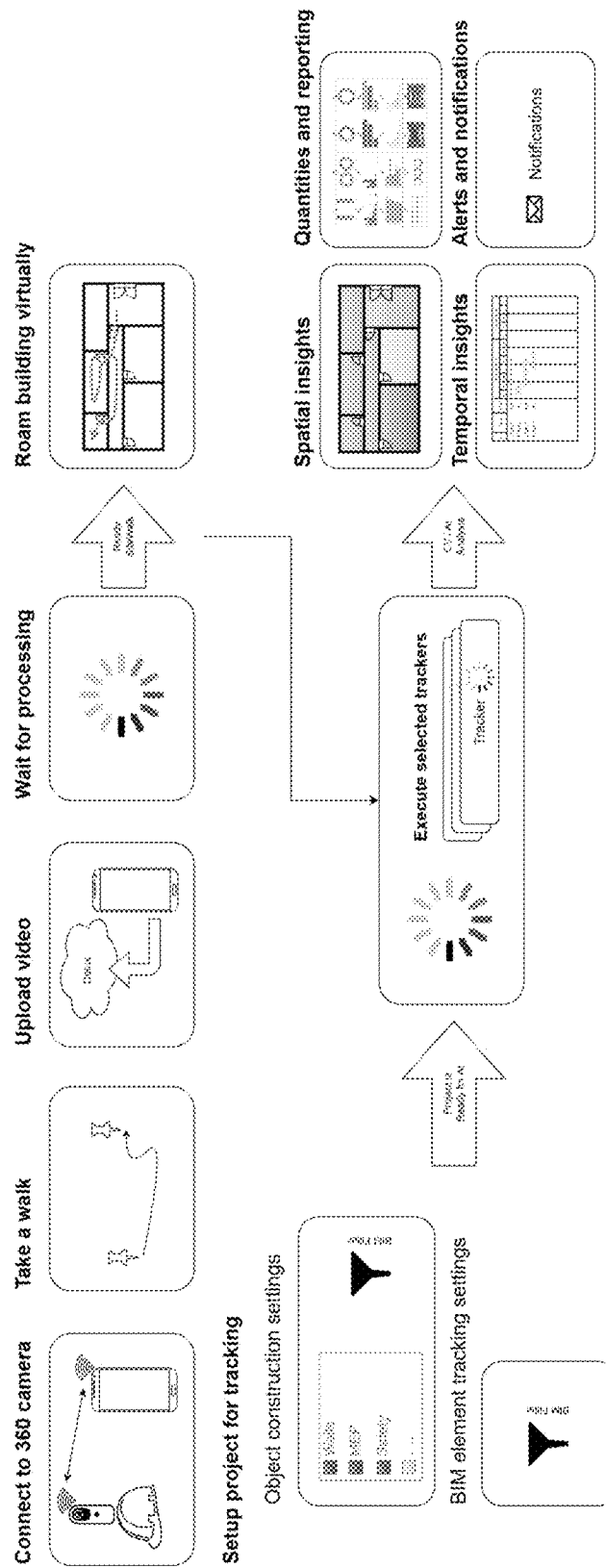
FIG. 2 shows a schematic representation of steps of a method for monitoring progress at a construction site.

FIG. 2 shows a schematic representation of steps of a method for monitoring progress at a construction site.

In contrast to the prior art, the present approach to integrating Computer Vision and AI/Machine Learning in the construction workflow is by utilizing the full dataset available in a 3D model. This includes both the geometry (3D elements such as walls, columns, doors, etc.) and all metadata for each single object put into the model (category, manufacturer, etc.).

This approach gives a full augmented understanding on how the world should look like. In contrast, 2D representations, such as floorplans, only includes symbolic representations of objects drawn as simple 2D pictograms. Such 2D pictograms needs intelligent translation to get semantic understand of the floorplan context. Such intelligent translations are easy for a human eye but can also to some extend be trained by tedious and time-consuming application of an AI. However, common for such a 2D representations is that all information is only given by lines, either in vector or raster format, leaving little to no formal information about the context.

This is a significant advantage of the present approach in contrast to the prior art. Each 3D object has the form and dimensions as expected in the real world, which gives us an exact representation of what should be identified in the 360 images. In contrast to a 2D pictogram which does not tell much about the actual object in the real world.

Applying a BIM Filter

Besides the geometric shape and position of each object of the BIM model, the object may further have assigned properties such as BIM identification marker, and/or key/value-pairs defined by the user/creator of the 3D model or BIM model. By creating a filter, here denoted a BIM Filter, a user can extract a sub-set of the BIM model by applying a filter operation. This will result in an isolated collection of BIM objects and their exact position in the BIM building. The filters are defined by the user since the user own and maintain the BIM building (including metadata etc.). As an example, a filter may be applied to only show all the windows of a BIM building.

Applying such a BIM Filters to a BIM building has a vast number of applications, comprising isolated visualization of elements and extracting quantities.

The isolated visualization of elements can be used to isolate and look at specific parts of the building or construction. For instance, a coherent visualization of all mechanical installations in the building, such as air-vents, without the visual obstruction of walls and other covering parts of the building.

The extraction of quantities means extracting the exact number of items (doors, electrical plugs, etc.) required in the building process. This can be correlated with budgets and supply chains etc.

This derives the state of the BIM building. Performing physical verification of the actual state of the construction site requires manual inspection. This process can be assisted with computer vision and machine learning as further described below.

Transferring Information from 3D BIM Model to Real World Images

The core of the present automatic tracking/verification system is to be able to transfer knowledge from the 3D BIM model domain onto images taken from the real world. This requires highly accurate estimations of the pose (location and direction) of each image or frame (here, a single 360 image) in BIM coordinates, i.e. coordinates of the 3D BIM model.

Automatically placing 360 images correctly in the BIM coordinate system includes computing a pose (position and orientation) of distinct key-frames from an incoming 360 video recorded at a construction site. This is done in several sequential steps. The conceptual steps in the processing pipeline are shown in FIG. 3.

FIG. 3 schematically indicates processing steps to establish a route in the 3D model from images recorded with a camera.

Besides the input (images, location/movement) and output (virtual rooms and reports), the system is composed of two distinct steps. First a SLAM system computes an initial guess of the covered route. This estimation is computed using both the visual input (the video) in conjunction with IMU and GPS sensor data. This initial estimate is then tried mapped to the BIM building by applying a vast range of machine learning algorithms that tries to pin-point visual markers of the BIM building in the images. If correspondence in both domains can be established with a certain likelihood this is gathered and collected in a central system. All the corresponding matches are combined by a particle filter that performs a Bayesian likelihood estimate of the correspondence between the observed matches. Most likely matches will contribute to the final triangulation of the actual position in the BIM building that will eventually converge towards a highly plausible fit to the BIM building.

The BIM Buffer

A pose consists of coordinates/location and orientation/direction of an image.

By having a mapping between the two domains (the 3D model and the images) knowledge can be transferred between the two domains on a pixel level. This is in practice executed by rendering synthetic images, virtual projections, of the BIM Building using the poses estimated from the real-world images. Given correct coordinates and orientation this will result in a similar image of the BIM Building. The virtual projections will not only comprise colour images but also augmented "buffers" which contains extended data for each pixel (BIM identification marker, distance, coordinates, surface orientation etc.). This buffer is referred to as the BIM buffer. The BIM buffer is used to achieve an easy way to map the 3D model to the incoming equirectangular images from the video. A way to do this (assuming knowledge of the location of incoming 360 equirectangular inside the BIM building) is to render a equirectangular representation of the BIM building at the same location, using a computer graphics pipeline, such as selected among OpenGL, Vulkan, Metal, and DirectX.

Making such a non-linear projection in OpenGL requires a two step approach since OpenGL only support linear transforms. Firstly, the scene is rendered into a cube map (with six sides) which is subsequently sampled, using the equirectangular projection, into a single texture.

FIG. 4 indicates how an equirectangular projection may be made.

Having a visual representation of the BIM building at the same coordinates has some limited use, as seen in FIG. 5, even in the absence of the additional information contained in the BIM model. To fully access specific information contained in the BIM model, such as details about the contained objects and metadata, additional steps are necessary.

FIG. 5 shows an image recorded at a construction site (left side) and a visual representation of a 3D BIM model at the same coordinates.

These steps comprising obtaining the expected world position, surface orientation, allowing lookup of the exact BIM object that should be available at each pixel in the 360 keyframe.

Thus, the system enables a user to point at an object in an image and get the information about the object from the 3D BIM model.

To accomplish the above, a buffer denoted a BIM buffer is created. A BIM buffer has similarities to the concept of a Geometry Buffer (aka. G-Buffer), which is used in rendering techniques such as deferred shading.

The BIM buffer consist of 3 buffers (2D arrays in the GPU, also referred to as render-targets). While rendering the BIM building, all the above-mentioned information is computed and written to all the buffers in a single pass. This results in a BIM-buffer layout comprising location (BIM coordinate), surface normals, distance from camera, any BIM identification marker and binary information indicating if this part is facing the camera.

FIG. 6 shows an example of a BIM buffer, consisting of 3 buffers. The first buffer comprises the world positions or x, y, and z coordinates. The second buffer comprises the surface normal, providing the orientation. The third buffer comprises the BIM ID or BIM identification marker, the depth or distance from the observer or camera, and binary information indicating if the buffer element is facing the observer or camera or not.

Having the above BIM buffer we can look up the world-position (BIM coordinate), the orientation (surface normal) and the BIM identification marker for each pixel in the 360 keyframe or image (assuming that the buffer is generated at the same location). This appears to be a powerful way to transfer information between these two domains, in the sense it is computationally efficient. The BIM buffer is also used for the distance peeling explained below.

Dual Representation: The 3D BIM Model and the Images of the Real World

The dual representation is the main link between the 3D BIM model and the images of the world. The dual representation is the backbone of looking for BIM objects and structures in the captured images.

The identification and classification of BIM elements in images can roughly be categorized in two groups.
  A. Single distinct objects.
  B. Objects which may appear in different stages of construction.

The first category is subject to binary classification, whether the object is present or not. Examples of such elements could be electrical installations, inventory, etc.

The second category covers objects that are large by nature and constructed or assembled at the construct site. This could be walls. Walls (especially non-bearing walls) can be in different stages such as: Not build, framing, plasterboard, plasterboard with joint component, and finished/painted. A single wall can also be in multiple of these stages simultaneously, e.g. where a section of the wall is at the stage of framing, while another section is at the stage of plasterboard. The system allows handling this as well.

An overall flowchart of the data processing can be seen in FIG. 7.

FIG. 7 shows how information from recorded images are processed to provide information about the presence of objects as well as information about the stage of progress of construction of objects. "SiteWalk" refers to obtaining images by walking through a building while filming with a camera, recording images as well as storing information about the coordinates and orientation of the images.

Distance Peeling

Before the process of identifying elements in the BIM building is started, it is important to generate a virtual version of the BIM building that resembles the current state of the real world. If the BIM building was augmented with timestamps for each element, this could be achieved by removing all elements that are planned to be build in the future. However, the purpose of the tracking software is to determine if the planned elements are build as expected. Further, in a real-life situation, it is likely that different parts of the building at any time are ahead of or lags behind the intended schedule of construction. To account for this, distance peeling is applied, to identify which construction elements, exemplified by walls, are constructed at a given time.

As an example, look at FIG. 8A-D. In the BIM building a wall is shown, FIGS. 8B and 8D, that is not yet present in the real world, FIGS. 8A and 8C. Note that FIG. 8A shows an image from a construction site, and FIG. 8B a corresponding representation of the 3D model at the same coordinates. As emphasized in FIG. 8C, a wall is missing in the image, while it is indicated in FIG. 8D of the 3D model that is has to be constructed.

By using a distance estimation from the real world, objects can be peeled away from the virtual projection rendered from the BIM model until each pixel in both the virtual projection and the image roughly have the same distance to the observer. This process needs to include a substantial amount of logic processing, since only specific elements (such as walls, doors, etc.) are subject to be pruned/peeled away. However, this process will result in an approximate representation of "what you see is what you get", thereby aligning the representation of the 3D BIM model with the actual captured images.

The BIM object verification still needs to be executed on the full subset of objects though. However, if the object has been subject to this distance pruning process, and still not identified in the image, the likelihood of it actually not having been build yet is significantly higher.

Distance Estimation from Point Cloud Representation

Determination of distances from a camera or an observer to objects and surfaces, such as walls, in the real world is a part of matching the artificial BIM model with the real world. The corresponding distance information is available in the BIM model due to the nature of the BIM model, having continuous geometry. However, the distance from an observer (the 360 camera) needs to be computed/estimated in the real-world case. For a video the subsequent poses of two images or keyframes may be used. By using these subsequent poses, it is possible to triangulate common landmarks, hence computing a point cloud representation of the environment. This semi-sparse point cloud can be densified and used to reconstruct a distance representation of the real-world that afterwards can be used for distance testing BIM objects against the real world. This is illustrated in FIG. 9.

FIG. 9 is a schematic representation of the use of a point cloud to estimate distances to identify the presence of a specific wall. The semi-sparse point cloud is stored in a voxel data structure (occupancy grid) which can be ray-intersected, to look up a distance from any given location in the scene. Ray-intersection with a voxel containing any points may correspond to a surface/object intersection.

Training and Use of a Machine Learning Model

Identification of distinct elements from the BIM building in the real-world require training a machine learning model specializing in identifying such corresponding elements. The FIG. below shows an example of such electrical elements represented in the BIM space with the corresponding elements found the 360 images. Using the full geometric properties and spatial relations we can make this process generic for many types of elements that have physical dimensions provided by the 3D BIM model.

FIG. 10 shows an image (left) captured by a camera and a representation of the corresponding part of the 3D model (right) at the same coordinates and with the same direction or orientation. Various objects of the image has been identified in the 3D model.

Exceptionally, if elements of a certain type are not capable of being encoded into a general "BIM to Image"-machine learning model, special trained models are implemented to handle edge-cases for complicated BIM element types. Switching between different models is possible using the knowledge embedded using the BIM filters managed by the user.

Monitoring the Progress of Construction of Objects

Tracking the state of a larger object, which is assembled or constructed at the site, requires additional processing compared to identifying single objects.

As an example, different sections of none load bearing walls can be in multiple stages at the same time. These are often constructed using an internal framing, with plasterboards applied outside. Spatula and painting are applied afterwards. To complicate matters more, the wall can be in different stages in different sections or even in the same section.

FIG. 11 shows four images recorded at the same coordinates at a construction site. A wall is being constructed, and the four stages are framing (upper left), framing with insulation (upper right), plasterboard (lower left), and finalized (lower right). Also shown in the images are various construction materials and devices.

According to the invention a machine learning model is trained to recognize and detect all the stages of construction of the wall (or other similar object) at the construction site.

The identification may be done by performing full image segmentation of the incoming 360 images using a machine learning model trained to identify these different stages of any object of interest. Having the 360 images completely aligned with the BIM building we can then, for each pixel, project the detected object and the stage with coordinates of the object back into BIM space.

All the detected objects and stages are summarized and stored in a spatial data structure in BIM space that allows predictions being made from multiple viewpoints (images or key frames) to collectively contribute to the final predictions of the system concerning the stage of construction of the objects. This summarization process is referred to as consensus-based voting, which is further explained below.

Consensus-Based Voting

To enhance the likelihood of the system identifying the correct stage of construction, the system utilizes the fact that the same element or surface can be seen by multiple keyframes, i.e. images. This is illustrated in FIG. 12.

FIG. 12 shows a route a camera has been carried with reference to a two-dimensional representation of a 3D model. Several images may be captured and processed, and the information from the images and coordinates combined to provide a consensus based on probabilities of the presence of an object estimated from the images.

Thus, the overall accuracy can be increased by incorporating the consensus-based voting before presenting a final result.

This voting can be applied to both the single element identification and to the construction progress tracking algorithms. All classifications (votes) are collected in BIM space using a spatial hash data structure. This is described below, as Spatial Hash for Voting.

Spatial Hash for Voting

A spatial hash data structure is a simple acceleration data structure to sub-divide any continuous space, such as a 3D space, into distinct voxel cubes. Each of these voxels are cubic with a length, height, and depth that is set to a specific number depending on the application. To increase processing speed, an optimal voxel size may be found. If the voxel size is too big, many objects may contribute to each voxel, increasing processing speed. On the contrary, if the voxel size is too small, it is necessary to iterate over too many voxels to get an estimate of the actual state of the construction object being analyzed.

Thus, the voxel size relates to the speed of processing data. Too small voxels cause many lookups, and may force a single surface (i.e. a wall) to be split in to a high number of very small sub-parts that may be harder to summarize by the subsequent consensus-based voting. On the contrary, too large voxels may result in a high number of different objects putting their predictions into the voxel, and this may result in more sorting pr. voxel.

Each prediction is marked with the BIM identification marker, so the origin of the prediction is included, thus several predictions from different object are possible to be separated out afterwards when iterating the votes.

For many purposes a voxel about 0.5×0.5×0.5 meters seems to provide a suitable compromise. But the exact size is part of the parameters that may be optimized by a user to achieve the overall desired performance of the system. The voxel may be perceived as a "voting bucket".

Larger objects (or surfaces, such as walls), may overlap several buckets/voxels. The apparently visible surface may be composed of pixels from the input-image and the BIM buffer. Each of these pixels are associated with a unique x, y, z position, which is retrieved from the BIM buffer, and contribute a specific surface area. After image segmentation and classification is done, by identifying the stage of construction, all the pixels are put into the spatial hash data structure along with their classification, which collectively contribute to a surface area of a specific class.

FIG. 13 is a schematic representation of a route a camera has been carried with reference to a two-dimensional representation of a 3D model. Several images may be captured and processed, and the information from the images and coordinates combined to provide consensus-based probabilities of the presence of an object estimated from the images. To speed up the process of object identification, the space may be divided into subspaces, also referred to as voxels, wherein said voxels have a length, a height and a depth.

FIG. 13A indicates with reference to a two-dimensional floorplan where three keyframes or images have been captured by a camera, each time capturing the same part of a wall. This part of the wall is then classified into stages of construction. The wall overlaps two buckets, see FIG. 13B. The classification is then split into both buckets or voxels for all three keyframes. This leaves 3 votes (with a class and surface area of the visible part of the wall) in each voxel. Summarization of these voxels is then fed into the consensus-based voting system to reach a final conclusion.

Correspondence between BIM building and captured images.

FIG. 14 shows a schematic representation of how the 3D model, a BIM building, and the images captured by the camera are processed. The position and direction (pose) of the images, here RGB 360 images, is used as an initial guess of the viewpoint for the BIM building. With this information, the BIM buffer is generated. In addition, BIM buffers are generated for alternative poses close to the poses of the images. Independent of this, a series of images is used to make depth estimation from the captured images, and thus provide RGBD (D for distance or depth) information for the captured images. The BIM buffer and RGBD information may now be compared, and the best estimated pose determined.

FIG. 15 shows a route a camera has been carried with reference to a two-dimensional representation of a 3D model. Several images may be captured and processed, here marked with open dots for the measured or initially estimated coordinates. For each of these alternative positions, marked with black dots, are used to generate expected images based on the 3D model. Comparing these expected images with the captured images, improved coordinates may be obtained.

System Output

The system provides output in various formats, such as a two-dimensional floor plan, providing visual representation of the stage of construction of walls.

FIG. 16 shows a two-dimensional plan of a 3D model. Different colors (not shown) may be applied to the walls to indicate the stage of construction of the walls.

The system further provides an overview of the presence of objects as well as the stages of construction of various objects, on numerous floors of a multi-story building.

FIG. 17 shows an overview of the stage of construction of various objects in a multi-story building.

From the foregoing, it will be appreciated that specific embodiments of the invention have been described herein for purposes of illustration, but that various modifications may be made without deviating from the scope of the invention. Accordingly, the invention is not limited except as by the appended claims.

Although the technology has been described in language that is specific to certain structures and materials, it is to be understood that the invention defined in the appended claims is not necessarily limited to the specific structures and materials described. Rather, the specific aspects are described as forms of implementing the claimed invention. Because many embodiments of the invention can be practiced without departing from the spirit and scope of the invention, the invention resides in the claims hereinafter appended.

Various features and details have been provided in the multiple designs described above. It is to be understood that any features or details of one design may be utilized for any other design, unless contrary to the construction or configuration. Any variations may be made.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

The invention claimed is:

1. A method for monitoring the progress of the construction of at least one object at a construction site, wherein said object is constructed in multiple stages at said site, said method comprising the steps of:
   a. providing a digital representation of a 3D model of at least part of said site, wherein said 3D model comprises a representation of said at least one object including coordinates of said object with respect to said 3D model;
   said 3D model optionally comprising metadata;
   b. capturing one or more images consisting of pixels at the site with a camera;
   c. providing an image location and direction for each of said one or more images allowing locating and orienting said images with respect to said 3D model;
   d. for each image location and direction rendering the 3D model into a virtual projection consisting of virtual pixels;
   e. using at least one of said images to detect a presence of said at least one object or a part of said at least one object by applying a machine learning model on said image, wherein the machine learning model has been trained to detect said object or a part of said at least one object;
   f. for each image where the presence of said object has been detected, identifying the stage of progress of construction of said at least one object applying a machine learning model on said image, wherein the machine learning model has been trained to recognize different stages of said multiple stages;
   g. feeding the rendered projection into a digital processor, thereby displaying or comparing a relevant part of the 3D model and the at least one image;
   h. presenting the stage of progress of the detected object with reference to the 3D model; and wherein step b. further comprises capturing at least two images with a camera from different locations of said site; and the method further comprises steps of localizing the detected objects comprising:

j-i. calculating the distance between the different locations;

j-ii. identifying any common features apparent in said at least two images;

j-iii. determining the coordinates of any identified common features by triangulation using the coordinates of said locations, the calculated distance between said locations, the direction of capture of said images, and the position of the identified common features in said at least two images;

j-iv. for each identified common feature adding a point to a point cloud representation at the coordinates determined by the triangulation;

j-v. aligning the point cloud representation with the 3D model; and j-vi. using the generated point cloud representation to confirm the presence of any detected objects with reference to the 3D model.

2. The method according to claim 1, wherein at least one of said step e. and step f. is performed by dividing each of said one or more images into segments, detecting the presence of said object in each segment, identifying the stage of progress of any part of said object present in each of said segments, and combining the results from the segments to obtain a conclusion concerning the stage of construction of said object.

3. The method according to claim 2, wherein probabilities are assigned to each of said segments, indicating the likelihood said object is present in each segment or the likelihood of each stage of progress of said object in said segment, followed by making a conclusion of the likely stage of progress of said object based on said assigned probabilities.

4. The method according to claim 1, wherein at least one of said step e. and step f. is performed by detecting the presence of said object in each of said images and identifying the stage of progress of said object present in each of said images without dividing the images into segments.

5. The method according to claim 1, wherein a final conclusion concerning the stage of construction of said object is obtained by:

i. performing at least one of said step e. and step f. by dividing each of said one or more images into segments, detecting the presence of said object in each segment or identifying the stage of progress of any part of said object present in each of said segments;

ii. performing at least one of said step e. and step f. by detecting the presence of said object in each of said images or identifying the stage of progress of said object present in each of said images without dividing the images into segments; and iii. comparing and combining the results from step i. and step ii. to obtain a final conclusion concerning the stage of construction of said object.

6. The method according to claim 1, wherein said virtual projection comprises for each virtual pixel:

i. the coordinates of the rendered part of the 3D model;

ii. the surface normal of the rendered part of the 3D model; and iii. any BIM identification marker of the rendered part of the 3D model.

7. The method according to claim 1, wherein identification of any common features between said at least two images of step j-ii. of claim 1 is performed by one or more methods selected among:

i. using a machine learning model on individual images; and i. using a machine learning model on multiple images.

8. The method according to claim 7, wherein the identification of common features in different images followed by triangulation to estimate distances are combined with an estimation of distances by using a machine learning model on individual images, to obtain improved distance estimates.

9. The method according to claim 1, wherein points in the point cloud are stored in an occupancy grid, allowing for distance lookup from any location in a BIM coordinate system.

10. The method according to claim 1, wherein said object is selected among a wall, a panel, an air-vent, and a cable-tray.

11. The method according to claim 1, wherein said object is a wall, and the stage is selected among not observed, concrete, stud framing, framing with insulation, plasterboard, painted, and finalized.

12. The method according to claim 1, comprising a step of generating output which is readable on a mobile device, such as a mobile phone or tablet computer, to show the stage of progress of construction of said object.

13. The method according to claim 1, comprising a step of generating output which is readable on a browser running on a computer to provide a report showing the stage of progress of construction of one or more objects of the 3D model.

14. The method according to claim 1, comprising applying a filter to generate output showing the stage of progress of construction of one or more objects of the 3D model, wherein said filter is selectable from one or more categories.

15. The method according to claim 14, wherein the categories are selected among walls, windows, doors, ventilation tubes, ventilation vents, water tubes, electrical installations, and/or fire alert systems.

16. The method according to claim 1, comprising visually presenting one or more of (i) the 3D model, (ii) the one or more images, and (iii) any detected objects and the progress of construction of said objects, by one or more of the following:

I. visual representations of (i) the 3D model with the corresponding (ii) image side by side, and (iii) any detected objects and the progress of construction of said objects;

II. a generated composite image of (i) and (ii), and (iii) any detected objects and the progress of construction of said objects, wherein the transparency of either or both (i) and (ii) may be toggled by a user;

III. the images (ii) and (iii) any detected objects and the progress of construction of said objects;

IV. a two-dimensional floor plan providing information about (iii) any detected objects and the progress of construction of said objects; and V. a summary report comprising information about and (iii) any detected objects and the progress of construction of said objects.

17. A system comprising a processor and memory, the system configured to perform steps a, d, e, f, g, h, j-i., j-iii., j-iv., j-v., and j-vi. of claim 1.

18. A method for monitoring the progress of the construction of at least one object at a construction site, wherein said object is constructed in multiple stages at said site, said method comprising the steps of:
  a. providing a digital representation of a 3D model of at least part of said site, wherein said 3D model comprises a representation of said at least one object including coordinates of said object with respect to said 3D model;
  said 3D model optionally comprising metadata;
  b. capturing one or more images consisting of pixels at the site with a camera;
  c. providing an image location and direction for each of said one or more images allowing locating and orienting said images with respect to said 3D model;
  d. for each image location and direction rendering the 3D model into a virtual projection consisting of virtual pixels;
  e. using at least one of said images to detect a presence of said at least one object or a part of said at least one object by applying a machine learning model on said image, wherein the machine learning model has been trained to detect said object or a part of said at least one object;
  f. for each image where the presence of said object has been detected, identifying the stage of progress of construction of said at least one object applying a machine learning model on said image, wherein the machine learning model has been trained to recognize different stages of said multiple stages;
  g. feeding the rendered projection into a digital processor, thereby displaying or comparing a relevant part of the 3D model and the at least one image; and
  h. presenting the stage of progress of the detected object with reference to the 3D model; said method further comprising:
  j-i. subdividing the space of the 3D model into voxels, wherein said voxels have a length, a height and a depth, and wherein said voxels are smaller than or equal to the size of said at least one object;
  j-ii. using the 3D model to determine which of said voxels may contribute at least part of said at least one object, to obtain a set of contributing voxels;
  j-iii. for each of said contributing voxels from step j-ii., determining the stage of progress of construction of the part of said at least one object within said contributing voxel by comparing with the results obtained from step f.;
  j-iv. feeding the results of step j-iii. from the set of contributing voxels into a consensus based voting system to identify the stage of progress of construction of said at least one object.

19. The method according to claim 18, wherein at least one of said step e. and step f. is performed by dividing each of said one or more images into segments, detecting the presence of said object in each segment, identifying the stage of progress of any part of said object present in each of said segments, and combining the results from the segments to obtain a conclusion concerning the stage of construction of said object.

20. The method according to claim 19, wherein probabilities are assigned to each of said segments, indicating the likelihood said object is present in each segment or the likelihood of each stage of progress of said object in said segment, followed by making a conclusion of the likely stage of progress of said object based on said assigned probabilities.

21. The method according to claim 18, wherein at least one of said step e. and step f. is performed by detecting the presence of said object in each of said images and identifying the stage of progress of said object present in each of said images without dividing the images into segments.

22. The method according to claim 18, wherein a final conclusion concerning the stage of construction of said object is obtained by:
  i. performing at least one of said step e. and step f. by dividing each of said one or more images into segments, detecting the presence of said object in each segment or identifying the stage of progress of any part of said object present in each of said segments;
  ii. performing at least one of said step e. and step f. by detecting the presence of said object in each of said images or identifying the stage of progress of said object present in each of said images without dividing the images into segments; and
  iii. comparing and combining the results from i. and ii. to obtain a final conclusion concerning the stage of construction of said object.

23. The method according to claim 18, wherein said virtual projection comprises for each virtual pixel:
  i. the coordinates of the rendered part of the 3D model;
  ii. the surface normal of the rendered part of the 3D model; and
  iii. any BIM identification marker of the rendered part of the 3D model.

24. The method according to claim 18, wherein said object is selected among a wall, a panel, an air-vent, and a cable-tray.

25. The method according to claim 18, wherein said object is a wall, and the stage is selected among not observed, concrete, stud framing, framing with insulation, plasterboard, painted, and finalized.

26. The method according to claim 18, comprising a step of generating output which is readable on a mobile device, such as a mobile phone or tablet computer, to show the stage of progress of construction of said object.

27. The method according to claim 18, comprising a step of generating output which is readable on a browser running on a computer to provide a report showing the stage of progress of construction of one or more objects of the 3D model.

28. The method according to claim 18, comprising applying a filter to generate output showing the stage of progress of construction of one or more objects of the 3D model, wherein said filter is selectable from one or more categories, wherein the categories are selected among walls, windows, doors, ventilation tubes, ventilation vents, water tubes, electrical installations, and/or fire alert systems.

29. The method according to claim 18, comprising visually presenting one or more of (i) the 3D model, (ii) the one or more images, and (iii) any detected objects and the progress of construction of said objects, by one or more of the following:
  I. visual representations of (i) the 3D model with the corresponding (ii) image side by side, and (iii) any detected objects and the progress of construction of said objects;
  II. a generated composite image of (i) and (ii), and (iii) any detected objects and the progress of construction of said objects, wherein a transparency of one or both of (i) and (ii) may be toggled by a user;
  III. the images (ii) and (iii) any detected objects and the progress of construction of said objects;
  IV. a two-dimensional floor plan providing information about (iii) any detected objects and the progress of construction of said objects; and V. a summary report comprising information about and
(iii) any detected objects and the progress of construction of said objects.

30. A system comprising a processor and memory, the system configured to perform steps a, d, e, f, g, h, j-i., j-ii., j-iii., and j-iv. of claim 18.

\* \* \* \* \*